United States Patent
Takakuwa

(10) Patent No.: US 8,741,509 B2
(45) Date of Patent: Jun. 3, 2014

(54) COLORED CURABLE COMPOSITION, COLOR FILTER, AND METHOD FOR PRODUCING COLOR FILTER

(75) Inventor: Hideki Takakuwa, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 242 days.

(21) Appl. No.: 13/496,815

(22) PCT Filed: Aug. 17, 2010

(86) PCT No.: PCT/JP2010/064135
§ 371 (c)(1),
(2), (4) Date: Mar. 16, 2012

(87) PCT Pub. No.: WO2011/033905
PCT Pub. Date: Mar. 24, 2011

(65) Prior Publication Data
US 2012/0182638 A1    Jul. 19, 2012

(30) Foreign Application Priority Data
Sep. 18, 2009   (JP) .................................. 2009-218042

(51) Int. Cl.
*G03F 7/00* (2006.01)
*G02B 5/20* (2006.01)

(52) U.S. Cl.
USPC .......................................... 430/7; 430/270.1

(58) Field of Classification Search
None
See application file for complete search history.

(56) References Cited

U.S. PATENT DOCUMENTS

| | | | | |
|---|---|---|---|---|
| 2009/0284697 | A1* | 11/2009 | Asahi et al. | ................... 349/106 |
| 2010/0271569 | A1 | 10/2010 | Ohkuma et al. | |

FOREIGN PATENT DOCUMENTS

| | | |
|---|---|---|
| JP | 2-199403 A | 8/1990 |
| JP | 10-031308 A | 2/1998 |
| JP | 10-221843 A | 8/1998 |
| JP | 2005-265995 A | 9/2005 |
| JP | 2006-317893 A | 11/2006 |
| JP | 2007-284592 A | 11/2007 |
| JP | 2007-320986 A | 12/2007 |
| JP | 2008-089708 A | 4/2008 |
| JP | 2009091551 A | 4/2009 |
| JP | 2009-168955 A | 7/2009 |
| JP | 2009191251 A | 8/2009 |
| JP | 2009-210871 A | 9/2009 |
| JP | 2010230828 A | 10/2010 |
| JP | 2010262003 A | 11/2010 |
| WO | 2009087886 A1 | 7/2009 |
| WO | 2010116653 A1 | 10/2010 |

OTHER PUBLICATIONS

Communication, dated May 28, 2013, issued in corresponding EP Application No. 10817018.4, 7 pages.
Notice of Reasons for Rejection, dated Nov. 26, 2013, issued in corresponding JP Application No. 2010-170694, 3 pages in English and Japanese.
Notice of Reasons for Rejection, dated Apr. 8, 2014, issued in corresponding JP Application No. 2010170694, 7 pages in English and Japanese.

* cited by examiner

*Primary Examiner* — John A. McPherson
(74) *Attorney, Agent, or Firm* — Sughrue Mion, PLLC

(57) ABSTRACT

A colored curable composition for a solid-state image sensor comprises a polyhalogenated zinc phthalocyanine pigment, and a compound having at least a structure represented by the following Formula (A).

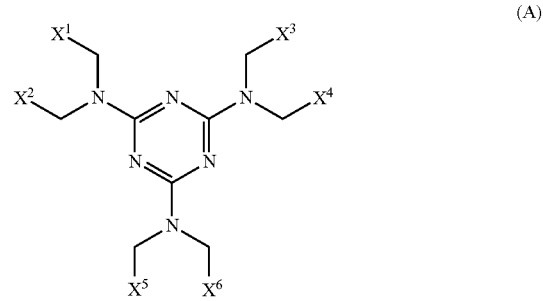

(A)

In Formula (A), $X^1$, $X^2$, $X^3$, $X^4$, $X^5$, and $X^6$ each independently represent a substituent selected from —OH, —OR, or —NHCOCH=$CH_2$, R represents a monovalent organic group. When the compound is an oligomer, the oligomer has a configuration in which at least one of $X^1$, $X^2$, $X^3$, $X^4$, $X^5$, and $X^6$ in a structure represented by Formula (A) is eliminated to form a single bond, which is then linked, via —O—, to another structure represented by Formula (A).

18 Claims, No Drawings

COLORED CURABLE COMPOSITION, COLOR FILTER, AND METHOD FOR PRODUCING COLOR FILTER

CROSS REFERENCE TO RELATED APPLICATIONS

This application is a National Stage of International Application No. PCT/JP2010/064135 filed Aug. 17, 2010, claiming priority based on Japanese Patent Application No. 2009-218042 filed Sep. 18, 2009 the contents of all of which are incorporated herein by reference in their entirety.

TECHNICAL FIELD

The invention relates to a colored curable composition suitable for making a color filter for a solid-state image sensor such as a CCD or CMOS, a color filter obtained using the colored curable composition, and a method for producing the color filter.

BACKGROUND ART

Color filters are essential components of solid-state image sensors. As a composition for a color filter, a negative-working curable composition including a pigment dispersion liquid, an alkali soluble resin, a photopolymerizable monomer, and a photopolymerization initiator has been proposed (for example, Japanese Patent Application Laid-Open (JP-A) No. 2-199403). In recent years, color filters for solid-state image sensors are required to provide higher image quality, and to form fine patterns while containing a high concentration of a colorant. While use of dyes in place of pigments as a colorant has been proposed (for example, JP-A No. 2006-317893), dyes have problems with color fastness. Therefore, at present, pigments are mainly used as the colorant.

It is known that a polyhalogenated zinc phthalocyanine having high chroma is used as a green colorant suitable for a solid-state image sensor (for example, JP-A Nos. 2007-284592 and 2007-320986). However, it has been found that when a green pattern is formed using the polyhalogenated zinc phthalocyanine, and red and blue patterns are further formed, needle crystals are generated in the green pattern.

In order to improve the contrast ratio of the color filter, a method for inhibiting the crystal growth caused by heating using a melamine compound has been proposed (for example, JP-A No. 2009-168955). However, the sufficient effect of preventing the formation of needle crystals cannot be obtained by using this method.

SUMMARY OF INVENTION

The present invention provides a colored curable composition for a solid-state image sensor that can form a colored cured film in which generation of needle crystals is suppressed even when the colored curable composition contains a polyhalogenated zinc phthalocyanine pigment as a colorant.

The present invention also provides a color filter for a solid-state image sensor obtained using the colored curable composition and having a color pattern with an excellent rectangular shape, and a method for producing the color filter with high productivity.

The inventors have found that generation of needle crystals can be suppressed in a green curable composition for a solid-state image sensor containing at least a polyhalogenated zinc phthalocyanine pigment by including a melamine compound having a specific structure, and thereby making the invention.

The present invention includes the following aspects:

<1> A colored curable composition for a solid-state image sensor, comprising a polyhalogenated zinc phthalocyanine pigment, and a compound having at least a structure represented by the following Formula (A):

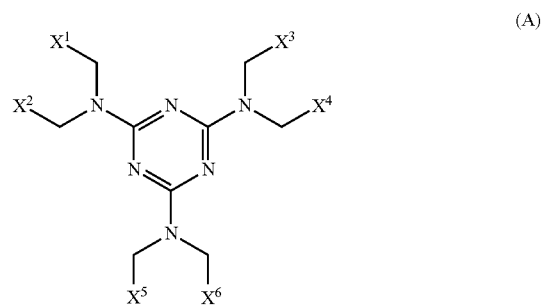

In Formula (A), $X^1$, $X^2$, $X^3$, $X^4$, $X^5$, and $X^6$ each independently represent a substituent selected from —OH, —OR, or —NHCOCH=CH$_2$, wherein R represents a monovalent organic group which may have a substituent. When the compound having the structure represented by Formula (A) is a monomolecular compound, $X^1$, $X^2$, $X^3$, $X^4$, $X^5$, and $X^6$ each have the same definitions as $X^1$, $X^2$, $X^3$, $X^4$, $X^5$, and $X^6$ above, respectively. When the compound having the structure represented by Formula (A) is an oligomer, the oligomer has a configuration in which at least one of $X^1$, $X^2$, $X^3$, $X^4$, $X^5$, and $X^6$ in a structure represented by Formula (A) is eliminated to form a single bond, which is then linked, via —O—, to another structure represented by Formula (A).

<2> The colored curable composition for a solid-state image sensor according to <1>, wherein a total solid content of the compound having at least a structure represented by Formula (A) in the colored curable composition is from 0.10% by mass to 10.0% by mass.

<3> The colored curable composition for a solid-state image sensor according to <1> or <2>, wherein the compound having at least a structure represented by Formula (A) is an oligomer having a number average molecular weight of from 500 to 10,000.

<4> The colored curable composition for a solid-state image sensor according to any one of <1> to <3>, further including a polymerizable compound and a photopolymerization initiator.

<5> The colored curable composition for a solid-state image sensor according to <4>, wherein the photopolymerization initiator is an oxime photopolymerization initiator.

<6> The colored curable composition for a solid-state image sensor according to <5>, wherein the oxime photopolymerization initiator is a compound represented by the following Formula (I).

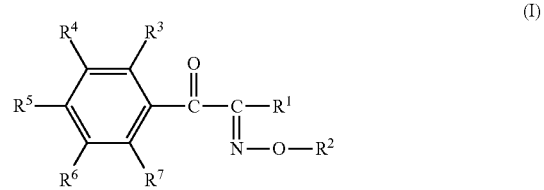

In Formula (I), $R^1$ represents an alkyl or aryl group which may have a substituent; $R^2$ represents an acyl group which may have a substituent; $R^3$, $R^4$, $R^5$, $R^6$, and $R^7$ each independently represent a hydrogen atom or a monovalent organic group; and $R^3$, $R^4$, $R^5$, $R^6$, and $R^7$ may be linked to each other to form a five- or six-membered ring.

<7> The colored curable composition for a solid-state image sensor according to any one of <1> to <6>, further including C.I. Pigment Yellow 139 as a colorant.

<8> The colored curable composition for a solid-state image sensor according to <7>, wherein a ratio of the content of the polyhalogenated zinc phthalocyanine pigment to the content of C.I. Pigment Yellow 139 (polyhalogenated zinc phthalocyanine pigment/C.I. Pigment Yellow 139) is from 100/50 to 100/60 in terms of mass.

<9> A color filter for a solid-state image sensor, comprising, on a support, a color pattern formed using the colored curable composition for a solid-state image sensor according to any one of <1> to <8>.

<10> A method for producing a color filter for a solid-state image sensor comprising:

applying the colored curable composition for a solid-state image sensor according to any one of <1> to <8> onto a support to form a colored curable composition layer;

exposing the colored curable composition layer in a pattern-wise manner; and developing the exposed colored curable composition layer to form a color pattern.

According to the present invention, there is provided a colored curable composition for a solid-state image sensor that can form a colored cured film in which generation of needle crystals is suppressed even when the colored curable composition contains a polyhalogenated zinc phthalocyanine pigment as a colorant.

In addition, according to the present invention, there is provided a color filter for a solid-state image sensor obtained using the colored curable composition and having a color pattern with an excellent rectangular shape, and a method for producing the color filter with high productivity.

MODES FOR CARRYING OUT THE INVENTION

Hereinafter, the colored curable composition, the color filter formed using the colored curable composition, and the method for producing the color filter according to the invention are described in detail.

Colored Curable Composition for Solid-State Image Sensor

The colored curable composition of the invention for a solid-state image sensor contains at least a polyhalogenated zinc phthalocyanine pigment as a colorant, and further contains a melamine compound having a specific structure as described in detail below. It is preferable that the colored curable composition of the invention further contains a photopolymerization initiator and a polymerizable compound. The photopolymerization initiator is preferably an oxime initiator.

The polyhalogenated zinc phthalocyanine pigment as an essential component of the colored curable composition of the invention is described below.

Polyhalogenated Zinc Phthalocyanine Pigment

The polyhalogenated zinc phthalocyanine pigment has a structure in which one phthalocyanine molecule (phthalocyanine structure) is substituted with up to 16 chlorine and/or bromine atoms in total. The hue of the polyhalogenated zinc phthalocyanine pigment is converted from blue to green as the number of the chlorine and/or bromine atoms in the molecule is increased. In order to obtain a green polyhalogenated zinc phthalocyanine pigment, it is preferable that 8 or more bromine atoms are contained as a halogen atom in one phthalocyanine. In order to form bright yellowish green shades, it is preferable that 12 or more bromine atoms are contained in one phthalocyanine molecule. In order to obtain strong yellowish green shades, it is preferable that the number of bromine atoms in one phthalocyanine molecule is larger than the number of chlorine atoms.

Examples of polyhalogenated zinc phthalocyanines include a compound represented by the following Formula (F).

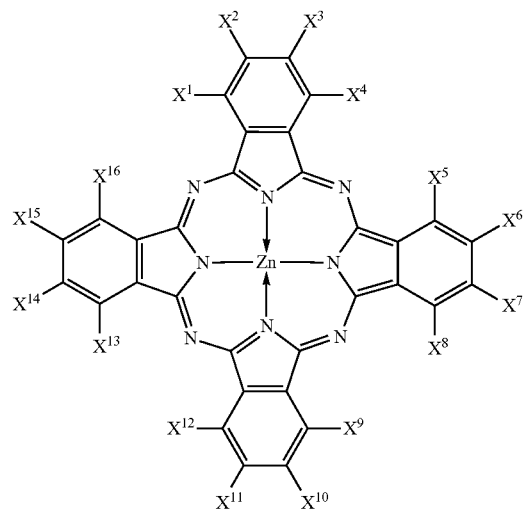

Formula (F)

In Formula (F), $X^1$ to $X^{16}$ each independently represent a chlorine atom, a bromine atom, or a hydrogen atom, and at least one of $X^1$ to $X^{16}$ is a chlorine atom or a bromine atom.

In particular, a compound represented by Formula (F) in which 8 or more of $X^1$ to $X^{16}$ are substituted with bromine atoms is suitable for the use in green pixels (a color pattern) of a color filter, since the compound forms a bright green color The number of substitutions with bromine atoms is more preferably from 10 to 14.

The polyhalogenated zinc phthalocyanine pigment used in the invention is preferably a polyhalogenated zinc phthalocyanine having an average primary particle diameter of 0.01 µm to 0.30 µm. In the present invention, the average primary particle diameter of the pigment is measured by the following method.

The average primary particle diameter in the invention is determined as follows: using a transmission electron microscope, particles in a certain visual field are imaged, and the longer diameter (major axis) and the shorter diameter (minor axis) of 100 primary particles of the halogenated zinc phthalocyanine pigment forming aggregates are measured and averaged in the two-dimensional image, and the average of the averaged major and minor axes is recorded as the average primary particle diameter.

In the colored curable composition of the invention, the polyhalogenated zinc phthalocyanine pigment may be used singly or in combination of two or more thereof. For example, plural polyhalogenated zinc phthalocyanine pigments having specific halogen atom compositions, which are different from one another in the substitution number of halogen atoms selected from bromine atoms and/or chlorine atoms in the formula (F), may be included at a specific ratio.

In a preferable embodiment, a polyhalogenated zinc phthalocyanine pigment containing 16 bromine atoms in one phthalocyanine molecule, and a polyhalogenated zinc phthalocyanine pigment containing 15 bromine atoms and one chlorine atom in one phthalocyanine molecule are used in combination. The ratio between them is preferably from 80:20 to 100:0.

The average composition of the polyhalogenated zinc phthalocyanine pigment included in the curable composition of the invention is determined by mass analysis based on mass spectroscopy and by halogen content analysis based on flask combustion-ion chromatography. In the same manner, the mole percentages of the individual specific polyhalogenated zinc phthalocyanine pigments in the polyhalogenated zinc phthalocyanine pigment composition are readily determined from the result of mass analysis.

The polyhalogenated zinc phthalocyanine pigment suitable for the use in the invention may be produced by the method described in JP-A No. 2007-320986 or 2008-19383. One of the polyhalogenated zinc phthalocyanine pigment is available as C.I. Pigment Green 58.

The method for converting a polyhalogenated zinc phthalocyanine into a form of a pigment is not particularly limited. For example, a polyhalogenated zinc phthalocyanine is converted into a form of a pigment concurrently with the dispersing the polyhalogenated zinc phthalocyanine into a dispersion medium. However, a solvent salt milling treatment is preferable compared with a solvent treatment in which a halogenated metal phthalocyanine is heated under stirring in a large amount of organic solvent, since crystal growth can be readily suppressed and pigment particles having large specific surface areas can be obtained by the solvent salt milling treatment.

The solvent salt milling treatment includes kneading and milling a polyhalogenated zinc phthalocyanine immediately after synthesis, or a polyhalogenated zinc phthalocyanine after milling but before conversion into a form of a pigment (coarse pigment), with an inorganic salt and an organic solvent.

When the solvent salt milling treatment is carried out, it is preferable to use the coarse pigment rather than the product immediately after synthesis. More specifically, the coarse pigment, an inorganic salt, and an organic solvent which will not dissolve the inorganic salt used for milling are charged into a kneader, and then kneaded and milled. The kneader may be, for example, a kneader or a mixing muller.

The inorganic salt that can be used for the solvent salt milling treatment is preferably a water-soluble inorganic salt, and preferable examples thereof include sodium chloride, potassium chloride and sodium sulfate. The average particle diameter of the inorganic salt is preferably from 0.5 μm to 50 μm. The inorganic salt having a predetermined particle diameter suitable for the salt milling treatment can be easily obtained by finely grinding the inorganic salt.

In the invention, the polyhalogenated zinc phthalocyanine pigment preferably has an average primary particle diameter of 0.01 μm to 0.10 μm, since such pigment is suitable for formation of a color pattern of the color filter for a solid-state image sensor. The conditions of the salt milling treatment may be determined such that the pigment has the particle diameter of the above range.

In order to obtain the polyhalogenated zinc phthalocyanine of the invention having the preferable particle diameter as described above, it is preferable that larger amount of the inorganic salt with respect to that of the coarse pigment is used during the solvent salt milling treatment. More specifically, the amount of the inorganic salt is preferably from 5 to 20 parts by mass, and more preferably from 7 to 15 parts by mass with respect to 1 part by mass of the coarse pigment.

The organic solvent used for the salt milling treatment is preferably a solvent in which the inorganic salt is insoluble, and can prevent the crystal growth.

Preferable examples of the organic solvent include water-soluble organic solvents such as diethylene glycol, glycerin, ethylene glycol, propylene glycol, liquid polyethylene glycol, liquid polypropylene glycol, 2-(methoxymethoxy)ethanol, 2-butoxyethanol, 2-(isopentyloxy)ethanol, 2-(hexyloxy)ethanol, diethylene glycol monomethyl ether, diethylene glycol monoethyl ether, diethylene glycol monobutyl ether, triethylene glycol, triethylene glycol monomethyl ether, 1-methoxy-2-propanol, 1-ethoxy-2-propanol, dipropylene glycol, dipropylene glycol monomethyl ether, dipropylene glycol monomethyl ether, and dipropylene glycol.

The amount of the organic solvent is not particularly limited, but preferably from 0.01 to 5 parts by mass with respect to 1 part by mass of the coarse pigment.

In a method for producing the polyhalogenated zinc phthalocyanine pigment composition, the coarse pigment alone may be subjected to the solvent salt milling treatment, or a combination of the polyhalogenated zinc phthalocyanine coarse pigment and a phthalocyanine derivative may be simultaneously subjected to the solvent salt milling treatment.

The phthalocyanine derivative is useful for improving the dispersibility of the pigment. The phthalocyanine derivative may be added during the solvent salt milling treatment, during the synthesis of the coarse pigment, or after the conversion into a form of a pigment. In order to further suppress the increase of viscosity during dispersion of the pigment, it is preferable that the phthalocyanine derivative is added before the process of conversion into a form of a pigment, such as the solvent salt milling treatment. The addition of the phthalocyanine derivative improves the viscosity properties of the colored curable composition for a color filter and the dispersion stability of the pigment.

The phthalocyanine derivative that can be used in the curable composition of the invention may be any known one, and is preferably a phthalocyanine pigment derivative represented by the following Formula (f-1) or Formula (f-2). The phthalocyanine derivative that can be used in the invention is preferably derived from a polyhalogenated zinc phthalocyanine, or from a zinc phthalocyanine which is the raw material of the polyhalogenated zinc phthalocyanine. As will be described later, since the addition amount of the phthalocyanine derivative is small, the derivative may be a polyhalogenated copper phthalocyanine derivative or a copper phthalocyanine derivative, which can also improve the viscosity properties and pigment dispersibility.

In Formulae (f-1) and (f-2), P represents an unsubstituted or halogen-substituted phthalocyanine residue with or without a central metal, in which m or n hydrogen atoms have been removed from a phthalocyanine ring; Y represents a monovalent substituent selected from a group consisting of primary, secondary and tertiary amino groups, carboxylic acid groups, and sulfonic acid groups, and the substituent may be in the form of a salt with a base or a salt with a metal; A represents a divalent linking group; Z represents a primary amino group, a secondary amino group or a nitrogen-containing heterocycle residue, from which one hydrogen atom on a nitrogen atom has been removed; m represents an integer of 1 to 4; and n represents an integer of 1 to 4.

In Formulae (f-1) and (f-2), the central metal of the phthalocyanine residue represented by P is preferably Zn.

Examples of the primary and secondary amino groups in Y include a monomethylamino group, a dimethylamino group, and a diethylamino group. Examples of the base or metal forming a salt with the carboxylic acid group or with the sulfonic acid group include organic bases such as ammonia, dimethylamine, diethylamine, and triethylamine, and metals such as potassium, sodium, calcium, strontium, and aluminum. Examples of the divalent linking group represented by A include alkylene groups having 1 to 3 carbon atoms, and divalent linking groups such as —$CO_2$—, —$SO_2$—, and —$SO_2NH(CH_2)$—. Examples of Z include a phthalimido group, a monoalkylamino group, and a dialkylamino group.

The amount of the phthalocyanine derivative added to the coarse pigment during the preparation of the coarse pigment and/or during solvent salt milling is usually from 0.01 to 0.3 parts by mass with respect to 1 part by mass of the coarse pigment. When the phthalocyanine derivative is added during the preparation of the coarse pigment and/or during the solvent salt milling treatment, the total amount of the coarse pigment and the phthalocyanine derivative is regarded as the used amount of the coarse pigment, and a used amount of the inorganic salt with respect to the total amount is preferably selected from the above-described range.

The temperature during the solvent salt milling is preferably from 30° C. to 150° C., and more preferably from 80° C. to 100° C. The period of the solvent salt milling is preferably from 5 hours to 20 hours, and more preferably from 8 hours to 18 hours.

In this manner, a mixture composed mainly of a halogenated zinc phthalocyanine pigment composition having an average primary particle diameter of 0.01 μm to 0.10 μm, an inorganic salt, and an organic solvent is obtained. The organic solvent and the inorganic salt are removed from the mixture, and, as necessary, the solid may be subjected to washing, filtration, drying, grinding, and any other process, thereby obtaining powder of the polyhalogenated zinc phthalocyanine pigment. The powder containing the polyhalogenated zinc phthalocyanine pigment and optionally the pigment derivative is hereinafter referred to as a polyhalogenated zinc phthalocyanine pigment composition.

The polyhalogenated zinc phthalocyanine pigment may be washed with water or hot water. The repeating number of washing may be 1 to 5. The mixture containing a water-soluble inorganic salt and a water-soluble organic solvent may be washed with water thereby readily removing the organic solvent and the inorganic salt. As necessary, the pigment may be washed with an acid, alkali, or solvent without changing the crystal condition.

After the above-described filtration and washing treatment, the pigment may be dried in a batch or continuous manner under heating at 80° C. to 120° C. by, for example, a heating source mounted on a dryer, thereby dehydrating and/or desolvating the pigment. The dryer may be, for example, a box dryer, a band dryer, or a spray-dryer. Spray drying is particularly preferable because the pigment is readily dispersed in the preparation of a paste. The grinding process after drying is carried out not for increasing the specific surface area and decreasing the average primary particle diameter, but for disassembling the pigment lumped during, for example, drying with a box dryer or a band dryer, thereby powdering the pigment. The grinding process may be achieved by, for example, a mortar, a hammer mill, a disc mill, a pin mill, or a jet mill. In this manner, a dry powder composed mainly of the polyhalogenated zinc phthalocyanine pigment composition may be obtained.

In the polyhalogenated zinc phthalocyanine pigment composition, it is preferable that the average primary particle diameter of the pigment is adjusted to from 0.01 μm to 0.10 μm to relatively weaken the agglomeration of the pigment and to achieve good dispersibility into a synthetic resin or the like to be colored. Accordingly, the pigment composition is suitable for the curable composition of the invention.

The polyhalogenated zinc phthalocyanine pigment composition is preferable because it is readily dispersed into a curable composition for a color filter, and as a result of which, the light shielding effect at 365 nm, which is a wavelength often used for curing the curable composition for a color filter, is reduced, the deterioration of the photocuring sensitivity of the resist is reduced, and thinning of the film or pattern collapse during development is prevented. As a result, a green pixel for a color filter achieving a high sharpness and a high lightness, which is required in recent years, is readily obtained.

The primary particle of the polyhalogenated zinc phthalocyanine pigment composition is preferably has an aspect ratio of 1 to 3 to improve the viscosity properties and flowability in various applications. In order to determine the aspect ratio, firstly, particles in the visual field are imaged under a transmission electron microscope or scanning electron microscope in the same manner as in the measurement of the average primary particle diameter. Thereafter, the longer diameter (major axis) and the shorter diameter (minor axis) of 50 primary particles forming aggregates in the two-dimensional image are measured and averaged, and these averages are used to calculate the aspect ratio.

In the preparation of the polyhalogenated zinc phthalocyanine pigment composition according to the invention, for example, a substance reducing light transmittance at a wavelength of 725 nm may be added at any time during the production of the above-described polyhalogenated zinc phthalocyanine pigment, or an existing polyhalogenated zinc phthalocyanine pigment having a high light transmittance at a wavelength of 725 nm may be mixed with a substance reducing light transmittance at a wavelength of 725 nm.

The substance reducing light transmittance at a wavelength of 725 nm preferably a substance which causes little problem for the applications of the polyhalogenated zinc phthalocyanine pigment composition. Examples of the active component of such substance include a surfactant.

For example, the surfactant may be added to the polyhalogenated zinc phthalocyanine pigment composition during the preparation of the coarse pigment and/or during and/or after the solvent salt milling treatment.

Examples of the surfactant used herein include an ampholytic surfactant and an anionic surfactant. The surfactant preferably has excellent adsorptivity for the polyhalogenated zinc phthalocyanine pigment such that as much portion as possible (preferably the whole amount) of the active component adsorbs to and covers the pigment. In particular, betaine-based ampholytic surfactants such as carboxybetaine, amide betaine, sulfobetaine, hydroxysulfobetaine, amide sulfobetaine, and phosphobetaine-based surfactants are preferable, since they can reduce light transmittance at 425 nm as well as at 725 nm, achieve higher color purity when used for the pattern formation in green pixels of a color filter, thereby providing a color filter achieving a broader RGB color region.

The amount of the surfactant that may be added to the polyhalogenated zinc phthalocyanine pigment composition is not particularly limited, but normally, in terms of mass, from 0.1 to 10 parts, preferably from 0.5 to 5 parts and more preferably from 1 to 3 parts, with respect to 100 parts of the polyhalogenated zinc phthalocyanine pigment composition.

The method for adding the surfactant is not particularly limited. In a preferable method, the pigment composition after the solvent salt milling treatment is dispersed in water, the surfactant is added in an appropriate amount within the above-described range, and the mixture is stirred under heating at room temperature to 140° C. for 30 to 300 minutes. In this method, filtration, washing, drying, and grinding are carried out in the same manner as the above-described procedure, thereby obtaining a dry powder composed mainly of the polyhalogenated zinc phthalocyanine pigment composition of the invention. The amount (so-called yield) of the surfactant as the active component contained in the polyhalogenated zinc phthalocyanine pigment composition may be determined based on, for example, the amount of the surfactant extracted from the pigment composition using a solvent, or the amount of the surfactant in the filtrate with respect to the charged amount of the surfactant.

Other Pigments

In accordance with the intended use, the curable composition of the invention may contain other pigments in addition to the polyhalogenated zinc phthalocyanine pigment.

For example, it is preferable that a yellow pigment is used in addition to the polyhalogenated zinc phthalocyanine pigment, which is a green pigment, for color control to obtain intended characteristics.

Examples of the yellow pigment used herein include yellow organic pigments such as C.I. Pigment Yellow 83, 110, 138, 139, 150, 180, and 185. Among them, C.I. Pigment Yellow 139 is preferable to achieve a uniform coating thickness.

The amount of the yellow pigment used in combination with the polyhalogenated zinc phthalocyanine pigment composition of the invention may be from 10 to 100 parts by mass, more preferably from 30 to 70 parts by mass, and still more preferably from 50 to 60 parts by mass, with respect to 100 parts by mass of the polyhalogenated zinc phthalocyanine pigment composition.

When C.I. Pigment Yellow 139, which is a preferable as a yellow pigment, is used, the content ratio of C.I. Pigment Yellow 139 to the polyhalogenated zinc phthalocyanine pigment (C.I. Pigment Yellow 139/the polyhalogenated zinc phthalocyanine pigment) in terms of mass is preferably from 50/100 to 60/100, and more preferably from 52/100 to 58/100.

When the polyhalogenated zinc phthalocyanine pigment composition of the invention is used, even when in combination with a yellow pigment for color control, it is possible to form green pixels for a color filter that have less turbidity and higher color purity, coloring power and lightness, compared to conventional combinations of pigments of two or more different colors for color control.

It is preferable that the addition of the polyhalogenated zinc phthalocyanine pigment to the curable composition is achieved by preparing a pigment dispersion liquid in advance, and then mixing the pigment dispersion liquid with the other components of the curable composition, in order to facilitate the dispersion of the pigment.

The pigment dispersion liquid is normally prepared from the polyhalogenated zinc phthalocyanine pigment composition, an organic solvent, and, as necessary, a dispersant.

Dispersant

In order to improve dispersibility of the pigment, the curable composition of the invention preferably contains a dispersant. It is preferable that the dispersant is mixed with the pigment in advance to make a pigment dispersion liquid.

Examples of the dispersant (pigment dispersant) that can be used in the invention include polymeric dispersants (such as polyamide amines and salts thereof, polycarboxylic acid and salts thereof, high molecular weight unsaturated acid esters, modified polyurethanes, modified polyesters, modified poly(meth)acrylates, (meta)acrylic copolymers, and naphthalene sulfonic acid formalin condensates), polyoxyethylene alkyl phosphate esters, polyoxyethylene alkylamine, alkanolamine, and pigment derivatives.

On the basis of the structure, the polymeric dispersants may be further classified into linear polymers, terminal modified polymers, graft polymers, and block polymers.

The polymeric dispersant adsorbs to the pigment surface to prevent the reaggregation of the pigment. Preferable examples of the structure thereof include terminal modified polymers, graft polymers and block polymers, which have a site to be anchored at the pigment surface. The pigment derivative modifies the pigment surface, and thereby promoting the adsorption of the polymeric dispersant.

The pigment dispersant that can be used in the invention may be a commercially-available product. Specific examples of commercially-available dispersants include DISPER-BYK-101 (polyamide amine phosphate), 107 (carboxylate ester), 110 (acid group-containing copolymer), 130 (polyamide), 161, 162, 163, 164, 165, 166 and 170 (polymeric copolymers), and BYK-P104 and P105 (high molecular weight unsaturated polycarboxylic acids) manufactured by BYK Chemie; EFKA 4047, 4050, 4010, 4165 (polyurethanes), EFKA4330, 4340 (block copolymers), 4400, 4402 (modified polyacrylates), 5010 (polyester amide), 5765 (high molecular weight polycarboxylate), 6220 (fatty acid polyester), 6745 (phthalocyanine derivative), and 6750 (azo pigment derivative) manufactured by EFKA; AJISPAR PB821 and PB822 manufactured by Ajinomoto Fine-Techno Co., Inc.; FLOWLEN TG-710 (urethane oligomer), and POLYFLOW No. 50E and No. 300 (acrylic copolymers) manufactured by Kyoeisha Chemical Co., Ltd.; DISPARLON KS-860, 873SN, 874, #2150 (aliphatic polycarboxylic acids), #7004 (polyether ester), DA-703-50, DA-705 and DA-725 manufactured by Kusumoto Chemicals, Ltd.; DEMOL RN, N (naphthalene sulfonic acid formalin polycondensates), MS, C, SN—B (aromatic sulfonic acid formalin polycondensates), HOMOGENOL L-18 (polymeric polycarboxylic acid), EMULGEN 920, 930, 935, 985 (polyoxyethylene nonyl phenyl ether), ACETAMIN 86 (stearylamine acetate) manufactured by Kao Corporation; SOLSPERSE 5000 (phthalocyanine derivative), 22000 (azo pigment derivative), 13240 (polyester amine), 3000, 17000, 27000 (polymers having functional moieties at terminals), 24000, 28000, 32000, 38500 (graft polymers) available from The Lubrizol Corporation; and NIKKOL T106 (polyoxyethylene sorbitan monooleate), and MYS-IEX (polyoxyethylene monostearate) manufactured by Nikko Chemicals Co., Ltd. Specific examples of commercially-available dispersants further include amphoteric dispersants such as HINOACT T-8000E (trade name, manufactured by Kawaken Fine Chemicals Co., Ltd.).

These dispersants may be used singly or in combination of two or more thereof. In the invention, it is preferable that a pigment derivative and a polymeric dispersant are used in combination.

In the invention, the content of the dispersant is preferably from 1% by mass to 100% by mass, more preferably from 3% by mass to 100% by mass and even more preferably from 5% by mass to 80% by mass, with respect to the mass of the pigment.

More specifically, the used amount of a polymeric dispersant is preferably from 5% by mass to 100% by mass, and more preferably from 10% by mass to 80% by mass with respect to the mass of the pigment. The used amount of a pigment derivative is preferably from 1% by mass to 30% by mass, more preferably from 3% by mass to 20% by mass, and particularly preferably from 5% by mass to 15% by mass with respect to the mass of the pigment.

It is important for a green color filter to reduce the transmittance at 400 nm to 450 nm and at 620 nm to 700 nm in a minimum film thickness, and thus a higher content of the colorant in the colored curable composition of the invention is preferable. However, if the colorant content is too high, the exposed areas may be insufficiently cured.

Therefore, the total amount of the pigment is preferably from 40% by mass to 80% by mass, more preferably from 43.0% by mass to 75% by mass and even more preferably from 44.0% by mass to 70% by mass, with respect to the total solid content of the curable composition.

Pigment Dispersing Resin

In the colored curable composition of the invention, it is preferable that the pigment is dispersed by a pigment dispersing resin as well as the above-described dispersant, from the viewpoint of improvement of the stability of the pigment over time through prevention of reaggregation.

The pigment dispersing resin may be any generally known linear organic polymer. In order to allow aqueous development or weak alkaline aqueous development, linear organic polymers soluble or swellable in water or weak alkaline water are preferably selected. Linear organic polymer is selected depending on its intended use as a film-forming component, an aqueous developer, weak alkaline aqueous developer, or organic solvent developer. For example, the use of a water-soluble organic polymer allows aqueous development.

Specifically, various compounds may be used, and examples thereof include cationic surfactants such as organosiloxane polymer KP341 (trade name, manufactured by Shin-Etsu Chemical Co., Ltd.), (meth)acrylic acid (co)polymer POLYFLOW No. 75, No. 90, No. 95 (trade names, manufactured by Kyoeisha Chemical Co., Ltd.), and W001 (trade name, purchased from Yusho Co., Ltd.); nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid ester; anionic surfactants such as W004, W005, W017 (trade names, purchased from Yusho Co., Ltd.); polymeric dispersants such as EFKA-46, EFKA-47, EFKA-47EA, EFKA polymer 100, EFKA polymer 400, EFKA polymer 401, EFKA polymer 450 (trade names, manufactured by Ciba Specialty Chemicals), DISPERSE AID 6, DISPERSE AID 8, DISPERSE AID 15, and DISPERSE AID 9100 (trade names, manufactured by San Nopco Limited); various SOLSPERSE dispersants such as SOLSPERSE 3000, 5000, 9000, 12000, 13240, 13940, 17000, 24000, 26000, and 28000 (trade names, purchased from The Lubrizol Corporation); ADEKA PLURONIC L31, F38, L42, L44, L61, L64, F68, L72, P95, F77, P84, F87, P94, L101, P103, F108, L121, P-123 (trade names, manufactured by ADEKA Corporation), ISONET S-20 (manufactured by Sanyo Chemical Industries, Ltd.), and DISPERBYK 101, 103, 106, 108, 109, 111, 112, 116, 130, 140, 142, 162, 163, 164, 166, 167, 170, 171, 174, 176, 180, 182, 2000, 2001, 2050, 2150 (manufactured by BYK-Chemie). Other examples include an oligomer and a polymer having a polar group at an end or a side chain of the molecule, such as an acrylic copolymer.

The weight average molecular weight of the pigment dispersing resin that can be used in the invention is preferably 5,000 or more, and more preferably from 10,000 to 300,000, and the number average molecular weight is preferably 1,000 or more, and more preferably from 2,000 to 250,000. The polydispersity (weight average molecular weight/number average molecular weight) is preferably 1 or more, and more preferably from 1.1 to 10.

The pigment dispersing resin may be a random, block, or graft polymer.

It is most important that the pigment dispersing resin that can be used in the invention will not impair the curability in the exposed areas. In order to achieve this, the pigment dispersing resin is preferably a resin that contains a structural unit selected from the structural units represented by the following Formulae (1) to (3).

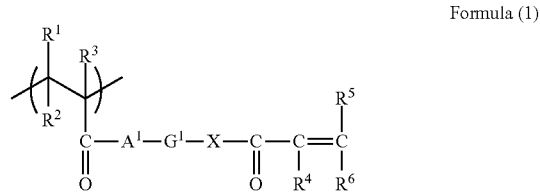

Formula (1)

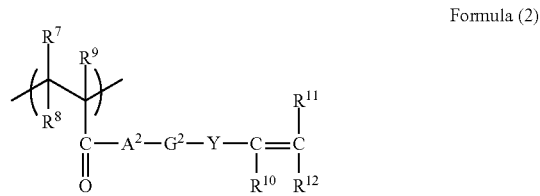

Formula (2)

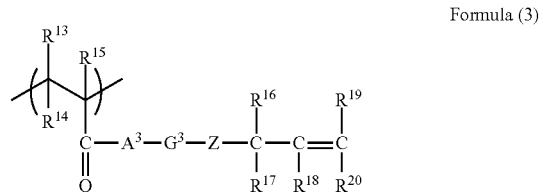

Formula (3)

In Formulae (1) to (3), $A^1$, $A^2$, and $A^3$ each independently represent an oxygen atom, a sulfur atom, or —$N(R^{21})$—, wherein $R^{21}$ represents an alkyl group which may have a substituent; $G^1$, $G^2$, and $G^3$ each independently represent a divalent organic group; X and Z each independently represent an oxygen atom, a sulfur atom, or —$N(R^{22})$—, wherein $R^{22}$ represents an alkyl group which may have a substituent; Y represents an oxygen atom, a sulfur atom, a phenylene group which may have a substituent, or —$N(R^{23})$—, wherein $R^{23}$ represents an alkyl group which may have a substituent; and $R^1$ to $R^{20}$ each independently represent a monovalent substituent group.

These resins are described in detail in JP-A No. 2003-262958, paragraphs [0006] to [0061], and the details of the method for producing the resins and preferable embodiments of the resins are described in JP-A No. 2003-262958, paragraphs [0028] to [0033] or JP-A No. 2003-335814. These polymers are also suitable as the dispersing resins in the invention.

Preferable examples of the resin obtained by the synthetic method of JP-A No. 2003-335814 include polymer compounds described in JP-A No. 2003-335814, and specific examples thereof include (i) polyvinyl compounds, (ii) polyurethane compounds, (iii) polyurea compounds, (iv) poly(urethane-urea) compounds, (V) polyester compounds, (vi) polyamide compounds, (vii) acetal modified polyvinyl alcohol compounds, and specific compounds obtained according to the above disclosures. These resins are also suitable as the dispersing resins.

In the invention, the pigment dispersing resin preferably has an acid value of from 5 mgKOH/g to 200 mgKOH/g, more preferably from 7 mgKOH/g to 150 mgKOH/g, and even more preferably from 10 mgKOH/g to 100 mgKOH/g. When the acid value is 200 mgKOH/g or less, pattern peeling during development can be reduced. When the acid value is 5 mgKOH/g or more, sufficient alkali developability can be achieved.

In the invention, the acid value can be calculated, for example, based on the average content of the acid groups in the resin molecules. The content of the monomer units having an acid group in the resin may be changed to obtain a resin having an intended acid value.

In the invention, specific examples of the pigment dispersing resin include the following polymer compounds P-1 to P-5.

| Polymer compound | | Acid value (mgKOH/g) | Mw |
|---|---|---|---|
| P-1 | | 54 | 15000 |
| P-2 | | 49 | 36000 |
| P-3 | | 34 | 24000 |

-continued

| Polymer compound | | Acid value (mgKOH/g) | Mw |
|---|---|---|---|
| P-4 | [structures] | 44 | 13000 |
| P-5 | [structures] | 43 | 10000 |

In the invention, the mass average molecular weight of the dispersing resin is preferably from 5,000 to 300,000, more preferably from 6,000 to 250,000, and even more preferably from 7,500 to 200,000, in order to prevent pattern peeling during development and obtain good developability.

The mass average molecular weight of the resin may be determined, for example, by GPC.

Photopolymerization Initiator

The colored curable composition of the invention preferably includes a photopolymerization initiator.

The photopolymerization initiator in the invention is a compound which is decomposed by light and initiates and promotes the polymerization of a polymerizable compound, and preferably has an absorption in the wavelength range of 300 nm to 500 nm. The photopolymerization initiator may be used singly or in combination of two or more thereof.

Examples of the photopolymerization initiator include organic halogenated compounds, oxadiazole compounds, carbonyl compounds, ketal compounds, benzoin compounds, acridine compounds, organic peroxide compounds, azo compounds, coumarin compounds, azide compounds, metallocene compounds, hexaarylbiimidazole compounds, organic boric acid compounds, disulfonic acid compounds, oxime ester compounds, onium salt compounds, and acylphosphine (oxide) compounds.

These photopolymerization initiators are described in detail in JP-A No. 2008-32803, paragraphs [0058] to [0078]. The compounds described therein are also useful in the invention.

From the viewpoint of exposure sensitivity, the photopolymerization initiator that can be used in the invention is preferably a compound selected from the group consisting of trihalomethyl triazine compounds, benzyl dimethyl ketal compounds, α-hydroxyketone compounds, α-aminoketone compounds, acyl phosphine compounds, phosphine oxide compounds, metallocene compounds, oxime compounds, biimidazole compounds, onium compounds, benzothiazole compounds, benzophenone compounds, acetophenone compounds and derivatives thereof, cyclopentadiene-benzene-iron complexes and salts thereof, halomethyloxadiazole compounds, and 3-aryl substituted coumarin compounds.

Among them, trihalomethyl triazine compounds, α-aminoketone compounds, acylphosphine compounds, phosphine oxide compounds, oxime compounds, biimidazole compounds, onium compounds, benzophenone compounds, and acetophenone compounds are more preferable; and at least one compound selected from the group consisting of trihalomethyl triazine compounds, α-aminoketone compounds, oxime compounds, biimidazole compounds, and benzophenone compounds is even more preferable. Oxime compounds are most preferable.

Examples of the oxime initiator suitable for the colored curable composition of the invention include the compound represented by the following Formula (I).

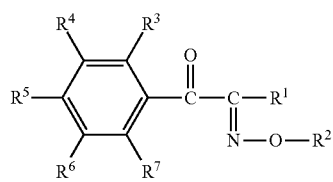

In Formula (I), $R^1$ represents an alkyl or aryl group which may have a substituent; $R^2$ represents an acyl group which may have a substituent, an alkyl group which may have a substituent, an aryl group which may have a substituent, an alkenyl group which may have a substituent, or an alkynyl group which may have a substituent; $R^3$, $R^4$, $R^5$, $R^6$, and $R^7$ each independently represent a hydrogen atom or a monovalent organic group; and $R^3$, $R^4$, $R^5$, $R^6$, and $R^7$ may be linked to each other to form a five- or six-membered ring.

Examples of the substituent that can be introduced to the alkyl, aryl, and acyl groups include a methyl group, an ethyl group, an n-propyl group, an n-butyl group, an i-propyl group, a t-butyl group, a chloro group, and a bromo group.

$R^1$ is preferably an alkyl group having 1 to 12 carbon atoms or a 4-($C_{1-4}$ alkylthio)phenyl group. $R^2$ is preferably an acetyl group or an acyl group, and preferably an acyl group.

When $R^3$, $R^4$, $R^5$, $R^6$ and $R^7$ each independently represent a monovalent organic group, the organic group is preferably a methyl group, an ethyl group, a methoxy group, an ethoxy group, a phenoxy group, or a thiophenoxy group, and more preferably a phenoxy group or a thiophenoxy group.

$R^3$, $R^4$, $R^6$, and $R^7$ are preferably hydrogen atoms. $R^5$ is preferably a group represented by $-SR^8$, and more preferably a group represented by the following formula.

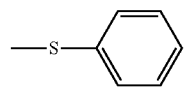

Among the oxime initiators represented by Formula (I), other examples of preferable initiators include the compound represented by the following Formula (4).

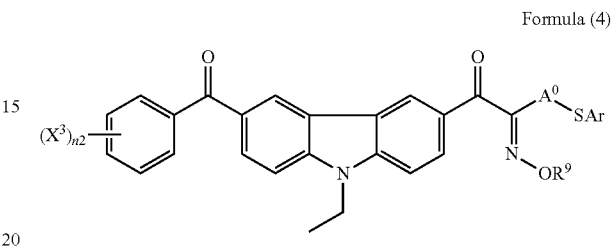

Formula (4)

In Formula (4), $R^9$ and $X^3$ each independently represent a monovalent substituent group; n2 represents an integer of 1 to 5; $A^0$ represents a divalent organic group; and Ar represents an aryl group. When n2 represents an integer of 2 to 5, each $X^3$ may be the same or mutually different from one another.

In Formula (4), the monovalent organic group represented by $R^9$ is preferably an acyl group, more specifically an acetyl group, a propionyl group, a benzoyl group, or a toluoyl group, in order to achieve high sensitivity.

In Formula (4), examples of the monovalent organic group represented by $X^3$ include a methyl group, an ethyl group, an n-propyl group, an n-butyl group, an i-propyl group, a t-butyl group, a methoxy group and an ethoxy group.

In Formula (4), examples of the divalent organic group represented by $A^0$ include an alkylene group having 1 to 12 carbon atoms, a cyclohexylene group, or an alkynylene group.

In Formula (4), the aryl group represented by Ar is preferably an aryl group having 6 to 30 carbon atoms, which may have a substituent. Examples of the substituent that can be introduced to the aryl group include a methyl group, an ethyl group, an n-propyl group, an n-butyl group, an i-propyl group, a t-butyl group, a methoxy group, and an ethoxy group.

Among them, Ar is preferably a substituted or unsubstituted phenyl group, form the viewpoint of improvement of sensitivity and prevention of coloration by heating over time.

In the invention, examples of the oxime compound suitable as the photopolymerization initiator include compounds described in JP-A No. 2000-80068; 1-(4-phenylsulfanyl-phenyl)-butane-1,2-dione 2-oxime-O-benzoate, 1-(4-phenylsulfanyl-phenyl)-octane-1,2-dione 2-oxime-O-benzoate, 1-(4-phenylsulfanyl-phenyl)-octane-1-one oxime-O-acetate, 1-(4-phenylsulfanyl-phenyl)-butane-1-one oxime-O-acetate. Among them, 1-(4-phenylsulfanyl-phenyl)-octane-1,2-dione 2-oxime-O -benzoate is preferable.

In the curable composition of the invention, the content of the photopolymerization initiator is preferably from 0.1% by mass to 50% by mass, more preferably from 0.5% by mass to 30% by mass, and still more preferably from 1% by mass to 20% by mass, with respect to the total solid content of the colored curable composition. When the content is within the above range, good sensitivity and pattern formation are achieved.

Sensitizer

The curable composition of the invention may contain a sensitizer for the purpose of improving the radical generation efficiency of the radical initiator, and shifting the photosensitive wavelength to a longer wavelength. The sensitizer that can be used in the invention preferably sensitizes the above-described photopolymerization initiator through an electron or energy transfer mechanism.

Examples of the sensitizer useful in the invention include the below-described compounds having an absorption wavelength in a range from 300 nm to 450 nm.

Preferable examples of the sensitizer include the following compounds having an absorption wavelength in a range from 330 nm to 450 nm.

Examples of preferable sensitizers include polynuclear aromatic compounds such as phenanthrene, anthracene, pyrene, perylene, triphenylene, and 9,10-dialkoxyanthracene; xanthenes such as fluorescein, eosin, erythrosine, Rhodamine B, and Rose Bengal; thiazines such as thioxanthones, cyanines, merocyanines, phthalocyanines, thionine, methylene blue, and toluidine blue; aromatic ketone compounds such as acridines, anthraquinones, squaryliums, coumarins, phenothiazines, phenazines, styrylbenzenes, azo compounds, diphenylmethane, triphenylmethane, distyrylbenzenes, carbazoles, porphyrin, spiro compounds, quinacridone, indigo, styryl, pyrylium compounds, pyrromethene compounds, pyrazolotriazole compounds, benzothiazole compounds, barbituric acid derivatives, thiobarbituric acid derivatives, acetophenone, benzophenone, and Michler's ketone; and heterocycle compounds such as N-aryl oxazolidinone.

More preferable examples of the sensitizer include the compounds described in JP-A No. 2008-214394, paragraphs [0085] to [0098]. These compounds are also suitable for the use in the invention.

The sensitizer may be used singly or in combination of two or more thereof.

The content of the sensitizer in the curable composition of the invention is preferably from 0.1% by mass to 20% by mass, and more preferably from 0.5% by mass to 15% by mass in terms of the solid content, from the viewpoints of the light absorption efficiency at the depth and the initiation decomposition efficiency.

Polymerizable Compound

The colored curable composition of the invention for a solid-state image sensor preferably includes a polymerizable compound. The polymerizable compound may be any compound as long as it has in the molecule thereof at least one unsaturated double bond, and is polymerized and cured by a radical initiator. Typical examples of the polymerizable compound include radically polymerizable monomers.

The radically polymerizable monomer is further described below. The radically polymerizable monomer preferably has a boiling point of 100° C. or higher under normal pressure, and has at least one addition-polymerizable ethylenically unsaturated group.

Examples of the compound having at least one addition-polymerizable ethylenically unsaturated group and a boiling point of 100° C. or higher under normal pressure include monofunctional (meth)acrylates such as polyethylene glycol mono(meth)acrylate, polypropylene glycol mono(meth)acrylate, and phenoxyethyl (meth)acrylate; polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol hexa(meth)acrylate, hexanediol (meth)acrylate, trimethylolpropane tri(acryloyloxypropyl)ether, tri(acryloyloxyethyl) isocyanurate, those obtained by the addition of ethylene oxide or propylene oxide to a polyfunctional alcohol such as glycerol or trimethylolethane followed by the (meth)acrylation thereof, those obtained by the poly(meth)acrylation of pentaerythritol or dipentaerythritol, urethane acrylates such as those described in Japanese Patent Application Publication (JP-B) Nos. 48-41708, 50-6034, and JP-A No. 51-37193, polyester acrylates such as those described in JP-A No. 48-64183, JP-B Nos. 49-43191 and 52-30490, and epoxy acrylates produced through the reaction between an epoxy resin and (meth)acrylic acid.

The photocurable monomers and oligomers described in *Nihon Secchaku Kyokaishi* (Journal of the Adhesion Society of Japan), Vol. 20, No. 7, pp. 300 to 308 may also be used.

The compounds obtained by the addition of ethylene oxide or propylene oxide to a polyfunctional alcohol such as those described above followed by the (meth)acrylation thereof, which are described in JP-A No. 10-62986 as the compounds represented by Formulae (1) and (2) together with the specific examples thereof, may also be used in the invention.

Among them, dipentaerythritol penta(meth)acrylate, dipentaerythritol hexa(meth)acrylate, and the structures in which a acryloyl group is bound via an ethylene glycol or propylene glycol residue are preferable. Oligomers of these compounds may be also used. In particular, monomers having five or more ethylene oxide structures are more preferable, and monomers having seven or more ethylene oxide structures are still more preferable.

Preferable examples of the polymerizable compound further include urethane acrylates described in JP-B No. 48-41708, JP-A No. 51-37193, JP-B Nos. 2-32293 and 2-16765, and urethane compounds having ethylene oxide skeletons described in JP-B Nos. 58-49860, 56-17654, 62-39417, and 62-39418. Further, by the use of the addition-polymerizable compounds having an amino or sulfide structure in the molecule thereof such as those described in JP-A Nos. 63-277653, 63-260909, and 1-105238, the photopolymerizable composition exhibiting a very high photosensitive speed can be obtained. Examples of commercially-available products thereof include urethane oligomers UAS-10, UAB-140 (trade names, manufactured by Sanyo-Kokusaku Pulp Co., Ltd.), UA-7200 (trade name, manufactured by Shin-nakamura Chemical Co., Ltd.), DPHA-40H (trade name, manufactured by Nippon Kayaku Co., Ltd.), UA-306H, UA-306T, UA-306I, AH-600, T-600, and AI-600 (trade names, manufactured by Kyoeisha Chemical Co., Ltd.).

In addition, ethylenically unsaturated compounds having acid groups are also preferable. Examples of commercially-available products include TO-756 (carboxyl group containing trifunctional acrylate) and TO-1382 (carboxyl group containing pentafunctional acrylate) manufactured by Toagosei Co., Ltd.

These polymerizable compounds may be used singly or in combination of two or more kinds thereof. When two or more kinds the polymerizable compounds are used in combination, it is preferable that at least one kind of the polymerizable compound is an ethylenically unsaturated compound having an ethylene oxide structure, and more preferable that two or more kinds of ethylenically unsaturated compounds having ethylene oxide structures, each of which have different number of functional groups, are used. As a result, sufficient developability and curability can be obtained at the same time.

The content of the polymerizable compound in the colored curable composition is preferably from 3.0% by mass to 50.0% by mass with respect to the total mass of the composition, in order to reduce residues of unexposed areas. For the same reason, the content is more preferably from 4.0% by mass to 25.0% by mass, and still more preferably fro, 5.0% by mass to 20.0% by mass.

Compound Having Structure Represented by Formula (A)

The colored curable composition for a solid-state image sensor of the invention includes a compound (Hereinafter, may be referred to as "specific compound (A)") having at least a structure represented by the following Formula (A).

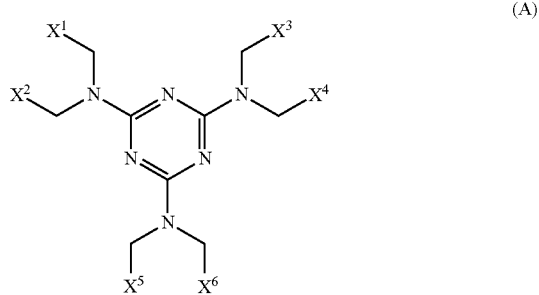

In Formula (A), $X^1$, $X^2$, $X^3$, $X^4$, $X^5$, and $X^6$ each independently represent a substituent selected from —OH, —OR, or —NHCOCH=CH$_2$, wherein R represents a monovalent organic group which may have a substituent. When the compound having the structure represented by Formula (A) is a monomolecular compound, $X^1$, $X^2$, $X^3$, $X^4$, $X^5$, and $X^6$ have the same definitions as $X^1$, $X^2$, $X^3$, $X^4$, $X^5$, and $X^6$ above, respectively. When the compound having the structure represented by Formula (A) is an oligomer, the oligomer has a configuration in which at least one of $X^1$, $X^2$, $X^3$, $X^4$, $X^5$, and $X^6$ in a structure represented by Formula (A) is eliminated to form a single bond, which is then linked, via —O—, to another structure represented by Formula (A).

Examples of the organic group which is represented by R and which may have a substituent include an alkyl group, an alkenyl group, an aryl group, and a heterocyclic group.

The alkyl group may be a linear, branched, or cyclic alkyl group preferably having 1 to 48 carbon atoms, and more preferably having 1 to 18 carbon atoms. Specific examples thereof include a methyl group, an ethyl group, a propyl group, an isopropyl group, a butyl group, a t-butyl group, a pentyl group, a hexyl group, a heptyl group, an octyl group, a 2-ethylhexyl group, a dodecyl group, a hexadecyl group, a cyclopropyl group, a cyclopentyl group, a cyclohexyl group, a 1-norbornyl group, and a 1-adamanthyl group.

The alkenyl group may be an alkenyl group preferably having 2 to 48 carbon atoms, and more preferably having 2 to 18 carbon atoms. Specific examples thereof include a vinyl group, an allyl group, and a 3-buten-1-yl group.

The aryl group may be an aryl group preferably having 6 to 48 carbon atoms, and more preferably having 6 to 12 carbon atoms. Specific examples thereof include a phenyl group and a naphthyl group.

The heterocyclic group may be a heterocyclic group preferably having 1 to 32 carbon atoms, and more preferably having 1 to 12 carbon atoms. Specific examples thereof include a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, and a benzotriazol-1-yl group.

When these organic groups represented by R each have a substituent, examples of the substituent which can be introduced include: halogen atoms (for example, fluorine, chlorine, and bromine); aryl groups preferably having 6 to 48 carbon atoms, and more preferably having 6 to 12 carbon atoms (for example, a phenyl group and a naphthyl group); heterocyclic groups preferably having 1 to 32 carbon atoms, and more preferably having 1 to 12 carbon atoms (for example, a 2-thienyl group, a 4-pyridyl group, a 2-furyl group, a 2-pyrimidinyl group, a 1-pyridyl group, a 2-benzothiazolyl group, a 2-imidazolyl group, a 1-pyrazolyl group, and a benzotriazol-1-yl group); silyl groups preferably having 3 to 38 carbon atoms, and more preferably having 3 to 12 carbon atoms (for example, a trimethylsilyl group, a triethylsilyl group, a tributylsilyl group, a t-butyldimethylsilyl group, and a t-hexyldimethylsilyl group); a hydroxyl group; a cyano group; a nitro group; alkoxy groups preferably having 1 to 48 carbon atoms, and more preferably having 1 to 12 carbon atoms (for example, a methoxy group, an ethoxy group, a 1-butoxy group, a 2-butoxy group, an isopropoxy group, a t-butoxy group, a dodecyloxy group, and a cycloalkyloxy group such as a cyclopentyloxy group or a cyclohexyloxy group); aryloxy groups preferably having 6 to 48 carbon atoms, and more preferably having 6 to 12 carbon atoms (for example, a phenoxy group and a 1-naphthoxy group); heterocyclic oxy groups preferably having 1 to 32 carbon atoms, and more preferably having 1 to 12 carbon atoms (for example, a 1-phenyltetrazol-5-oxy group and a 2-tetrahydropyranyloxy group); silyloxy groups preferably having 1 to 32 carbon atoms, and more preferably having 1 to 12 carbon atoms (for example, a trimethylsilyloxy group, a t-butyldimethylsilyloxy group, and a diphenylmethylsilyloxy group); acyloxy groups preferably having 2 to 48 carbon atoms, and more preferably 2 to 12 carbon atoms (for example, an acetoxy group, a pivaloyloxy group, a benzoyloxy group, and a dodecanoyloxy group);

alkoxycarbonyloxy groups preferably having 2 to 48 carbon atoms, and more preferably having 2 to 12 carbon atoms (for example, an ethoxycarbonyloxy group, a t-butoxycarbonyloxy group, and cycloalkyloxycarbonyloxy group such as a cyclohexyloxycarbonyloxy group); aryloxycarbonyloxy groups preferably having 7 to 32 carbon atoms, and more preferably having 7 to 18 carbon atoms (for example, a phenoxycarbonyloxy group); carbamoyloxy groups preferably having 1 to 48 carbon atoms, and more preferably having 1 to 12 carbon atoms (for example, a N, N-dimethylcarbamoyloxy group, a N-butylcarbamoyloxy group, a N-phenylcarbamoyloxy group, and a N-ethyl-N-phenylcarbamoyloxy group); sulfamoyloxy groups preferably having 1 to 32 carbon atoms, and more preferably having 1 to 12 carbon atoms (for example, a N,N-diethylsulfamoyloxy group and a N-propylsulfamoyloxy group); alkylsulfonyloxy groups preferably having 1 to 38 carbon atoms, and more preferably having 1 to 12 carbon atoms (for example, a methylsulfonyloxy group, a hexadecylsulfonyloxy group, and a cyclohexylsulfonyloxy group); arylsulfonyloxy groups preferably having 6 to 32 carbon atoms, and more preferably having 6 to 12 carbon atoms (for example, a phenylsulfonyloxy group); acyl groups preferably having 1 to 48 carbon atoms, and more preferably having 1 to 12 carbon atoms (for example, a formyl group, an acetyl group, a pivaloyl group, a benzoyl group, a tetradecanoyl group, and a cyclohexanoyl group); alkoxycarbonyl groups preferably having 2 to 48 carbon atoms, and more preferably having 2 to 12 carbon atoms (for example, a methoxycarbonyl group, an ethoxycarbonyl group, an octadecyloxycarbonyl group, and a cyclohexyloxycarbonyl group); aryloxycarbonyl groups preferably having 7 to 32 carbon atoms, and more preferably having 7 to 12 carbon atoms (for example, a phenoxycarbonyl group);

carbamoyl groups preferably having 1 to 48 carbon atoms, and more preferably having 1 to 12 carbon atoms (for example, a carbamoyl group, a N,N-diethylcarbamoyl group, a N-ethyl-N-octylcarbamoyl group, a N,N-dibutylcarbamoyl group, a N-propylcarbamoyl group, a N-phenylcarbamoyl group, N-methyl-N-phenylcarbamoyl group, and a N,N-dicyclohexylcarbamoyl group); amino groups preferably having 32 or less carbon atoms, and more preferably having 12 or less carbon atoms (for example, an amino group, a methylamino group, a N,N-dibutylamino group, a tetradecylamino group, a 2-ethylhexylamino group, and a cyclohexylamino group); anilino groups preferably having 6 to 32 carbon atoms, and more preferably having 6 to 12 carbon atoms (for example, an anilino group and a N-methylanilino group); heterocyclic amino groups preferably having 1 to 32 carbon atoms, and more preferably having 1 to 12 carbon atoms (for example, a 4-pyridylamino group); carbon amide groups preferably having 2 to 48 carbon atoms, and more preferably having 2 to 12 carbon atoms (for example, an acetamide group, a benzamide group, a tetradecanamide group, a pivaloylamide group, and a cyclohexanamide group); ureido groups preferably having 1 to 32 carbon atoms, and more preferably having 1 to 12 carbon atoms (for example, a ureido group, a N,N-dimethylureido group, and a N-phenylureido group); imide groups preferably having 20 or less carbon atoms, and more preferably having 12 or less carbon atoms (for example, a N-succinimide group and a N-phthalimide group); alkoxycarbonylamino groups preferably having 2 to 48 carbon atoms, and more preferably having 2 to 12 carbon atoms (for example, a methoxycarbonylamino group, an ethoxycarbonylamino group, a t-butoxycarbonylamino group, an octadecyloxycarbonylamino group, and a cyclohexyloxycarbonylamino group); aryloxycarbonylamino groups preferably having 7 to 32 carbon atoms, and more preferably having 7 to 12 carbon atoms (for example, a phenoxycarbonylamino group);

sulfonamide groups preferably having 1 to 48 carbon atoms, and more preferably having 1 to 12 carbon atoms (for example, a methanesulfonamide group, a butanesulfonamide group, a benzenesulfonamide group, a hex adecanesulfonamide group, and a cyclohexanesulfonamide group); sulfamoylamino groups preferably having 1 to 48 carbon atoms, and more preferably having 1 to 12 carbon atoms (for example, a N,N-dipropylsulfamoylamino group and a N-ethyl-N-dodecylsulfamoylamino group); azo groups preferably having 1 to 48 carbon atoms, and more preferably having 1 to 24 carbon atoms (for example, a phenylazo group and a 3-pyrazolylazo group); alkylthio groups preferably having 1 to 48 carbon atoms, and more preferably having 1 to 12 carbon atoms (for example, a methylthio group, an ethylthio group, an octylthio group, and a cyclohexylthio group); arylthio groups preferably having 6 to 48 carbon atoms, and more preferably having 6 to 12 carbon atoms (for example, a phenylthio group); heterocyclic thio groups preferably having 1 to 32 carbon atoms, and more preferably having 1 to 12 carbon atoms (for example, a 2-benzothiazolylthio group, a pyridylthio group, and a 1-phenyltetrazolylthio group); alkylsulfinyl groups preferably having 1 to 32 carbon atoms, and more preferably having 1 to 12 carbon atoms (for example, a dodecanesulfinyl group); arylsulfinyl groups preferably having 6 to 32 carbon atoms, and more preferably having 6 to 12 carbon atoms (for example, a phenylsulfinyl group); alkylsulfonyl groups preferably having 1 to 48 carbon atoms, and more preferably having 1 to 12 carbon atoms (for example, a methylsulfonyl group, an ethylsulfonyl group, a propylsulfonyl group, a butylsulfonyl group, an isopropylsulfonyl group, a 2-ethylhexylsulfonyl group, a hexadecylsulfonyl group, an octylsulfonyl group, and a cyclohexylsulfonyl group); arylsulfonyl groups preferably having 6 to 48 carbon atoms, and more preferably having 6 to 12 carbon atoms (for example, a phenylsulfonyl group and a 1-naphthylsulfonyl group);

sulfamoyl groups preferably having 32 or less carbon atoms, and more preferably having 16 or less carbon atoms (for example, a sulfamoyl group, a N, N-dipropylsulfamoyl group, a N-ethyl-N-dodecylsulfamoyl group, a N-ethyl-N-phenylsulfamoyl group, and a N-cyclohexylsulfamoyl group); a sulfo group; a phosphonyl groups preferably having 1 to 32 carbon atoms, and more preferably having 1 to 12 carbon atoms (for example, a phenoxyphosphonyl group, an octyloxyphosphonyl group, and a phenylphosphonyl group); and phosphinoylamino groups preferably having 1 to 32 carbon atoms, and more preferably having 1 to 12 carbon atoms (for example, diethoxyphosphinoylamino group and a dioctyloxyphosphinoylamino group).

Among these, the substituent R preferably represents an unsubstituted alkyl group, and specifically a methyl group, an ethyl group, a propyl group, an isopropyl group, a butyl group, and an isobutyl group are preferable. The substituent R most preferably represents a methyl group.

The compound represented by Formula (A) preferably has all of —OH, —OR and —NHCOCH=CH$_2$ in a molecule thereof. Specifically, in Formula (A), it is preferable that at least one of $X^1$, $X^2$, $X^3$, $X^4$, $X^5$, and $X^6$ represents —OH, at least one of $X^1$, $X^2$, $X^3$, $X^4$, $X^5$, and $X^6$ represents —OR, and at least one of $X^1$, $X^2$, $X^3$, $X^4$, $X^5$, and $X^6$ represents —NHCOCH=CH$_2$. It is more preferable that the compound represented by Formula (A) has two —NHCOCH=CH$_2$ substituents in a molecule thereof.

The compound having a structure represented by Formula (A) may be a monomolecular compound having the structure represented by Formula (A), or may be a compound including two or more structures each represented by Formula (A). When the compound is a monomolecular compound, the compound has the structure represented by Formula (A). When the compound is an oligomer having two or more structures each represented by Formula (A), the oligomer is formed in such a manner that at least one of $X^1$, $X^2$, $X^3$, $X^4$, $X^5$, and $X^6$ in one structure represented by Formula (A) is eliminated to form a single bond, which is then linked, via —O—, to another structure represented by Formula (A).

The oligomer preferably includes two or more structures each represented by the following Formula (A-1). In Formula (A-1), "*" indicates a linking portion with another structure represented by Formula (A-1). In the following, the structure represented by Formula (A-1) has two linking portions at $X^2$ and $X^4$; however, the linking portions are not limited thereto, because the structure represented by Formula (A-1) is symmetrical with respect to the heterocyclic ring of Formula (A-1). In an embodiment, the compound is a dendrimer in which the structure represented by Formula (A) has, at $X^1$ or $X^2$, $X^3$ or $X^4$, and $X^5$ or $X^6$ thereof, other structures each represented by Formula (A).

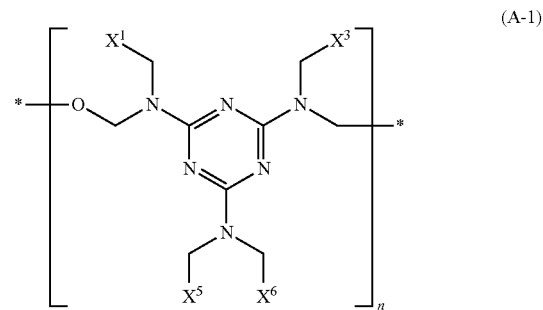

In Formula (A-1), $X^1$, $X^3$, $X^5$ and $X^6$ have the same definitions as those of $X^1$, $X^3$, $X^5$ and $X^6$ of Formula (A), respectively; and n represents an integer of from 2 to 20.

Regarding the portions represented by "*" when plural (n=2 to 20) structural units each represented by Formula (A-1) are linked with each other, the linking portion with —O— is a hydrogen or R, and the linking portion with —C— is —OH, —OR or —NHCOCH=$CH_2$, wherein R has the same definitions as described above.

When the compound having a structure represented by Formula (A) is an oligomer, it is preferable that the oligomer has a number average molecular weight of from 500 to 10,000 in order to obtain better effect of preventing the formation of needle matter. In this regard, the compound having a structure represented by Formula (A) is preferably linked with another compound having a structure presented by Formula (A), as represented by Formula (A-1). The number average molecular weight of the oligomer is more preferably from 750 to 5,000, and still more preferably from 1,000 to 2,500. The number average molecular weight of the oligomer may be measured by the following method.

The number average molecular weight of the oligomer having a structure as represented by Formula (A-1) may be measured by GPC.

In the invention, the conditions used in GPC for determining the molecular weight are as described below.
Apparatus: HLC-8220 GPC (trade name, manufactured by Tosoh Corporation)
Columns: TSK GUARD COLUMN SUPER AW-H (4.6 mm I.D.×35 mm)
TSK GEL SUPER AW5000 (6.0 mm I.D.×150 mm)
Eluent: 0.25 mol/L lithium bromide-NMP solution
Flow rate: Sample pump 0.39 ml/min
Reference pump 0.1 ml/min
Temperature: Inlet oven 50° C.
Column oven 50° C.
RI detector 45° C.

Specific examples of the compound including a partial structure represented by Formula (A) are shown below, but it should be understood that the invention is not limited thereto.

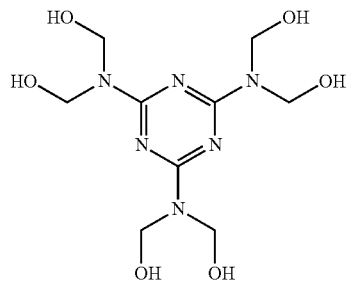
(A-1)

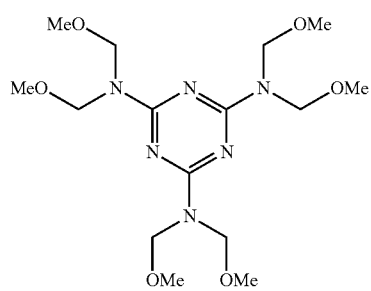
(A-2)

-continued

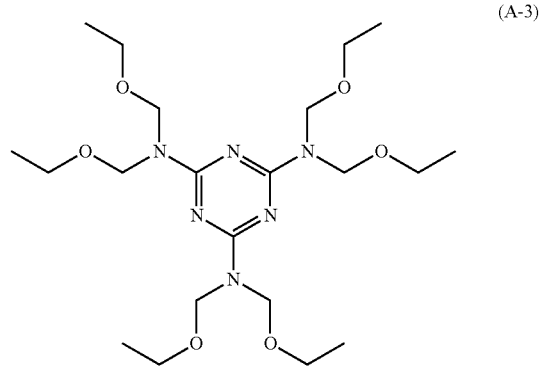
(A-3)

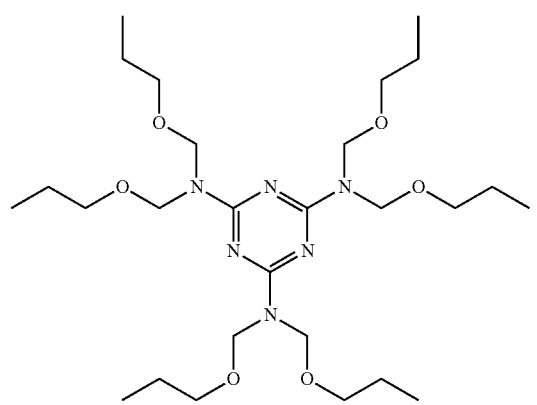
(A-4)

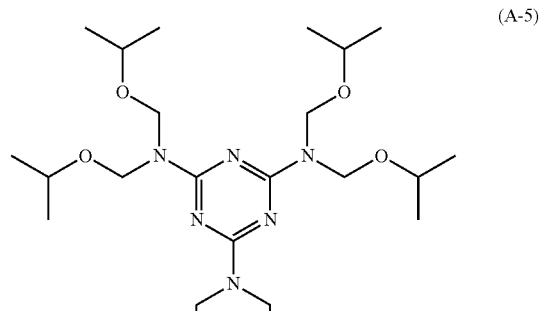
(A-5)

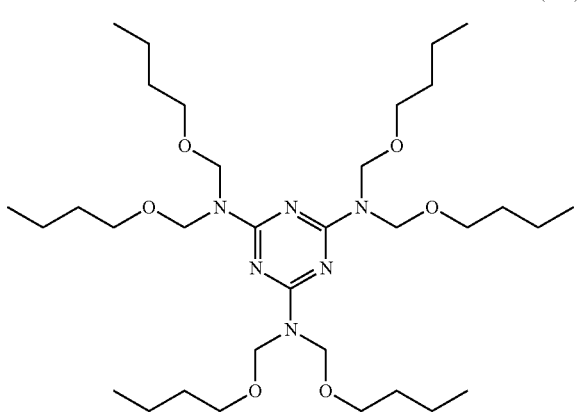
(A-6)

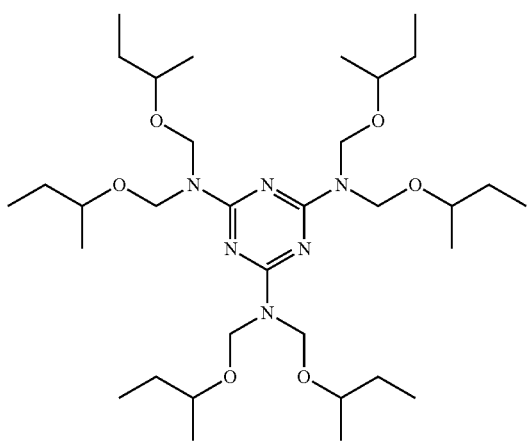

(A-7)

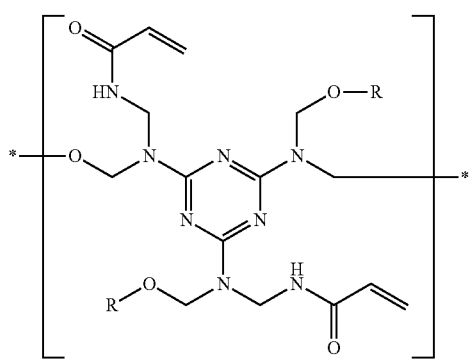

(A-8)

R = H or CH₃ or C₄H₉
Mn ~ 1750

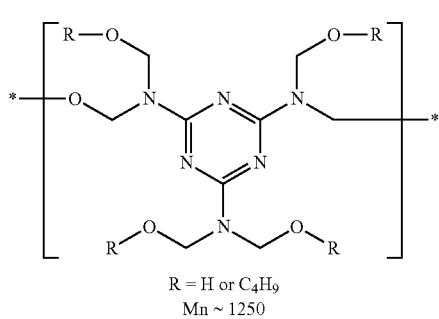

(A-9)

R = H or C₄H₉
Mn ~ 1250

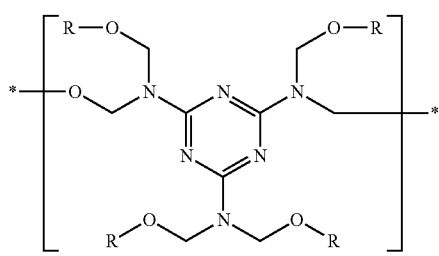

(A-10)

R = H or iBu
Mn ~ 1600

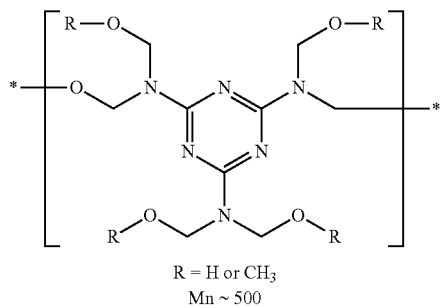

(A-11)

R = H or CH₃
Mn ~ 500

The colored curable composition of the invention may include only one type of the specific compound (A), or may include two or more types of the specific compounds (A). When two or more types of specific compounds (A) are used, a combination of plural different types of monomolecular compounds, a combination of plural different types of oligomers, or a combination of at least one type of monomolecular compound and at least one type of oligomer may be used.

The total solid content of the specific compound (A) in the colored curable composition of the invention is preferably from 0.10% by mass to 10.0% by mass, in order to obtain a pattern having an excellent rectangular shape when the pattern is formed using the curable color composition. The content of the compound of Formula (A) is more preferably from 0.25% by mass to 7.5% by mass, and still more preferably from 0.50% by mass to 6.0% by mass.

Epoxy Compound

The colored curable composition of the invention for a solid-state image sensor may further contain an epoxy compound. The epoxy compound in the invention is not particularly limited as long as it has at least one oxirane ring (epoxy group) in the molecule thereof, and may be a monomer, oligomer, or polymer (epoxy resin). Among them, epoxy resins having 10 or more epoxy groups in the molecule thereof are preferable.

Examples of the epoxy compound suitable for the use in the invention include epoxy resins. Epoxy resins generically refer to compounds having two or more oxirane rings (epoxy groups) in the molecule thereof. Examples of the epoxy resin include, as described in "Recent advance in epoxy resins (*Epoxy Jushi Saikin no Shinpo*) (Shokodo Co., Ltd., Hiroshi Kakiuchi, 1990)", bisphenol A epoxy resins, bisphenol F epoxy resins, novolac epoxy resins, brominated epoxy resins, glycidylamine epoxy resins, epoxy resins having a naphthalene skeleton, epoxy resins having a bisphenol skeleton, trifunctional epoxy resins, tetrafunctional epoxy resins, imide group-containing epoxy resins, and alicyclic epoxy resins.

The epoxy resin that can be used in the invention may be a commercially-available product. Specific examples thereof include the following compounds.

Examples of the bisphenol A epoxy resin include EPICLON860, 1050, 1055, 2050, 3050, 4050, 7050, HM-091, HM-101 (manufactured by DIC Corporation), ADEKA RESIN EP-4100, EP-4100G, EP-4100E, EP-4100W, EP-4100TX, EP-4300E, EP-4340, EP-4200, EP-4400, EP-4500A, EP-4510, EP-4520, EP-45205, EP-4520TX, and EP-4530 (manufactured by Asahi Denka Company Limited).

Examples of the bisphenol F epoxy resin include EPICLON830, 830-S, 835, EXA-830CRP, EXA-830LVP, EXA-835LV (manufactured by DIC Corporation), ADEKA RESIN EP-4901, EP-4901E, and EP-4950 (manufactured by Asahi Denka Company Limited).

Examples of the novolac epoxy resin include EPICLON N-660, N-665, N-670, N-673, N-680, N-690, N-695, N-665-EXP, N-672-EXP, N-655-EXP-S, N-662-EXP-S, N-665-EXP-S, N-670-EXP-S, N-685-EXP-S, N-673-80M, N-680-75M, N-690-75M, N-740, N-770, N-775, N-740-80M, N-770-70M, N-865, and N-865-80M (manufactured by DIC Corporation).

Examples of the alicyclic epoxy resin include CELLOX-IDE 2021P, 2081, 2083, 2085, 3000, and EHPE3150 (manufactured by Daicel Chemical Industries, Ltd.).

Examples of the trifunctional epoxy resin include EPOLEAD GT300 (manufactured by Daicel Chemical Industries, Ltd.).

Examples of the tetrafunctional epoxy resin include EPOLEAD GT400 (manufactured by Daicel Chemical Industries, Ltd.).

Other examples of the epoxy resin that can be used in the invention include resins obtained through the polymerization of a compound having a (meth)acryl group and an epoxy group, such as a glycidyl methacrylate homopolymer.

Among these epoxy resins, polyfunctional epoxy resins are preferable to obtain better effect of preventing the formation of needle matter. More specifically, epoxy compounds having 5 to 50 epoxy groups in the molecule thereof are preferable, and epoxy compounds having 10 to 25 epoxy groups in the molecule thereof are more preferable.

Specific examples of the polyfunctional epoxy resin include various novolac epoxy resins (the number of oxetane rings in the molecule is from 3 to 30), EHPE-3150 (the number of oxetane rings in the molecule is about 15; manufactured by Daicel Chemical Industries, Ltd.), and resins obtained through the polymerization of a compound having a (meth)acryl group and an epoxy group (the number of oxetane rings in the molecule is from 3 to 50).

The molecular weight of the epoxy resin is preferably 1,500 or more but 100,000 or less, more preferably from 1,750 or more but 10,000 or less, and even more preferably 2,000 or more but 7,000 or less.

When the epoxy compound is used in the colored curable composition of the invention, the content of the epoxy compound in the colored curable composition is preferably from 1% by mass to 15% by mass. When the addition amount of the epoxy compound is 1% by mass or more, the sufficient effect of preventing the formation of needle matter can be obtained. In addition, when the addition amount of the epoxy resin is 15% by mass or less, thickening over time is prevented, and a uniform layer can be readily formed using the colored curable composition. The addition amount of the epoxy resin is more preferably from 2% by mass to 10% by mass, and still more preferably from 3% by mass to 7.5% by mass.

When the colored curable composition of the invention is used for forming a color pattern of the below-described color filter, the epoxy compound may be used in combination with the polyhalogenated zinc phthalocyanine pigment and the specific compound (A) to form a green pattern in green pixels. It is more preferable that red pixels and blue pixels formed using a colored curable composition for red pixels and a colored curable composition for blue pixels, both of which contain the epoxy compound, respectively, are used in combination with green pixels formed using the colored curable composition of the invention.

Binder Polymer

The curable composition of the invention may further contain, as necessary, a binder polymer for improving the film properties. The binder is preferably a linear organic polymer. Those known in the art may be used as the linear organic polymer.

Co-Sensitizer

It is preferable that the curable composition of the invention further contains a co-sensitizer. In the invention, the co-sensitizer further improves the sensitivity of the sensitizing dye and initiator to active radiation, or prevents inhibition of polymerization of the polymerizable compound caused by oxygen.

Examples of the co-sensitizer include amines such as the compounds described in M. R. Sander et al, "Journal of Polymer Society", vol. 10, p. 3173 (1972), JP-B No. 44-20189, JP-A Nos. 51-82102, 52-134692, 59-138205, 60-84305, 62-18537, 64-33104, and Research Disclosure No. 33825. Specific examples thereof include triethanolamine, ethyl p-dimethylaminobenzoate, p-formyldimethylaniline, and p-methylthiodimethylaniline.

Other examples of the co-sensitizer include thiols and sulfides such as thiol compounds described in JP-A No. 53-702, JP-B No. 55-500806, and JP-A No. 5-142772, and disulfide compounds described in JP-A No. 56-75643, and specific examples thereof include 2-mercaptobenzothiazole, 2-mercaptobenzoxazole, 2-mercaptobenzimidazole, 2-mercapto-4 (3H)-quinazoline, and β-mercaptonaphthalene.

Examples of the co-sensitizer further include amino acid compounds such as N-phenylglycine, organometallic compounds described in JP-B No. 48-42965, such as tributyl tin acetate, hydrogen donors described in JP-B No. 55-34414, and sulfur compounds described in JP-A No. 6-308727, such as trithiane.

The content of the co-sensitizer is preferably from 0.1% by mass to 30% by mass, more preferably from 1% by mass to 25% by mass, and even more preferably from 0.5% by mass to 20% by mass with respect to the mass of the total solid content of the curable composition, from the viewpoint of improving the curing rate based on the balance between the polymerization growth rate and chain transfer.

Polymerization Inhibitor

In the invention, it is preferable that a small amount of a heat polymerization inhibitor is added to the curable composition in order to prevent unnecessary heat polymerization of the compound having a polymerizable ethylenically unsaturated double bond during manufacture or storage of the curable composition.

Examples of the heat polymerization inhibitor that can be used in the invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butyl phenol), and N-nitrosophenylhydroxyamine primary cerium salt.

The addition amount of the heat polymerization inhibitor is preferably from about 0.01% by mass to about 5% by mass with respect to the total mass of the composition. As necessary, in order to prevent polymerization inhibition caused by oxygen, a higher fatty acid derivative such as behenic acid or behenic acid amide may be added to the composition so as to be located on the surface of the photosensitive layer during the drying step after application of the composition. The addition amount of the higher fatty acid derivative is preferably from about 0.5% by mass to about 10% by mass with respect to the total mass of the composition.

Solvent

In general, it is preferable that the colored curable composition according to the invention is prepared using a solvent together with each of the components described above.

Specific examples of the solvent include esters, such as ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate; 3-oxypropionate alkyl esters such as methyl 3-oxypropionate and ethyl 3-oxypropionate; methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanoate and ethyl 2-oxobutanoate;

ethers, such as diethyleneglycol dimethyl ether, tetrahydrofuran, ethyleneglycol monomethyl ether, ethyleneglycol monoethyl ether, methyl cellosolve acetate, polyethylene glycol methyl ether acetate, ethyl cellosolve acetate, diethyleneglycol monomethyl ether, diethyleneglycol monoethyl ether, diethyleneglycol monobutyl ether, propyleneglycol monomethyl ether acetate, propyleneglycol methyl ether acetate, propyleneglycol ethyl ether acetate and propyleneglycol propyl ether acetate;

ketones, such as methyl ethyl ketone, cyclohexanone, 2-heptanone and 3-heptanone; and aromatic hydrocarbons, such as toluene and xylene.

Among these, methyl 3-ethoxypropionate, ethyl 3-ethoxypropionate, ethyl cellosolve acetate, polyethylene glycol methyl ether acetate, ethyl lactate, propyleneglycol monomethyl ether acetate, diethyleneglycol dimethyl ether, n-butyl acetate, methyl 3-methoxypropionate, 2-heptanone, cyclohexanone, and propyleneglycol methyl ether acetate are more preferable.

The solvent may be used singly or in combination of two or more kinds thereof.

Surfactant

The colored curable composition according to the invention may contain a surfactant in order to improve the coatability. Examples of the surfactant that can be used in the invention include various surfactants such as a fluorine-containing surfactant, a nonionic surfactant, a cationic surfactant, an anionic surfactant, and a silicone surfactant.

In particular, when the colored curable composition according to the invention contains a fluorine-containing surfactant, the liquid properties (in particular, fluidity) of the composition prepared as a coating liquid are improved, and the uniformity of the coating thickness and the liquid saving property can be improved.

That is, when a colored curable composition including a fluorine-containing surfactant is used as a coating liquid to form a film, the wettability on the surface to be coated is improved due to decrease in the surface tension between the surface to be coated and the coating liquid, and the coatability on the surface to be coated is improved. Therefore, even when a thin film of several micrometers is formed with a small amount of the liquid, a film with uniform thickness may be suitably formed.

The fluorine content in the fluorine-containing surfactant is preferably from 3% by mass to 40% by mass, more preferably from 5% by mass to 30% by mass, and still more preferably from 7% by mass to 25% by mass. When the fluorine content of the fluorine-containing surfactant is within the above range, it is effective in terms of the uniformity of the coating film thickness and the liquid saving, and excellent solubility in the colored curable composition can be achieved.

Examples of the fluorine-containing surfactant include MEGAFAC F171, F172, F173, F176, F177, F141, F142, F143, F144, R30, F437, F475, F479, F482, F554, F780 and F781 (trade names, manufactured by DIC Corporation), FLUORAD FC430, FC431 and FC171 (trade names, manufactured by Sumitomo 3M Limited), SURFLON S-382, SC-101, SC-103, SC-104, SC-105, SC-1068, SC-381, SC-383, S-393 and KH-40 (trade names, manufactured by Asahi Glass Co., Ltd.), and SOLSPERSE 20000 (trade name, manufactured by Lubrizol Japan Limited).

Examples of the nonionic surfactant include glycerol, trimethylolpropane and trimethylolethane, and an ethoxylate or propoxylate product thereof (such as glycerol propoxylate or glycerin ethoxylate); polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid esters such as PLURONIC L10, L31, L61, L62, 10R5, 17R2 and 25R2, and TETRONIC 304, 701, 704, 901, 904 and 150R1 (trade names, manufactured by BASF).

Examples of the cationic surfactant include phthalocyanine modified compounds such as EFKA-745 (trade name, manufactured by Morishita & Co., Ltd.), organosiloxane polymers such as KP341 (trade name, manufactured by Shin-Etsu Chemical Co., Ltd.); (meth)acrylic acid based (co)polymers such as POLYFLOW No. 75, No. 90, No. 95 (trade names, manufactured by Kyoeisha Chemical Co., Ltd.); and W001 (trade name, available from Yusho Co., Ltd.).

Examples of the anionic surfactant include W004, W005 and W017 (trade names, available from Yusho Co., Ltd.).

Examples of the silicone surfactant include TORAY SILICONE DC3PA, SH7PA, DC11PA, SH21PA, SH28PA, SH29PA, SH30PA and SH8400 (trade names, manufactured by Dow Corning Toray Co., Ltd.), TSF-4440, 4300, 4445, 4460 and 4452 (trade names, manufactured by Momentive Performance Materials Inc.), KP341, KF6001, and KF6002 (trade names, manufactured by Shin-Etsu Chemical Co., Ltd.), and BYK307, 323 and 330 (trade names, manufactured by BYK Chemie).

These surfactants may be used singly or in combination of two or more kinds thereof.

Other Additives

In the invention, known additives such as an inorganic filler for improving the physical properties of the cured film, a plasticizing agent, and an oil-sensitizing agent for improving the ink adherability on the photosensitive layer surface may be added to the composition.

Examples of the plasticizing agent include dioctyl phthalate, didodecyl phthalate, triethylene glycol dicaprylate, dimethylglycol phthalate, tricresyl phosphate, dioctyl adipate, dibutyl sebacate, and triacetyl glycerin. When a binder is used, the plasticizing agent may be added in an amount of 10% by mass or less with respect to the total mass of the compound having an ethylenically unsaturated double bond and the binder.

The curable composition of the invention is cured with high sensitivity and exhibits good storage stability. In addition, the curable composition exhibits good adhesion to a hard material surface such as a substrate to be coated with the curable composition, and in the cured film, the generation of needle crystals is suppressed and the lightness thereof is high. Accordingly, the curable composition of the invention is suitable for the uses in image forming materials for three-dimensional optical molding, holography, and color filters, as well as inks, paints, adhesives, and coating agents.

Color Filter and Method for Producing the Same

The color filter of the invention and the method for producing the same are described below.

The color filter of the invention includes a color pattern formed from the curable composition of the invention on a support.

The color filter of the invention is further described below with reference to the method for producing the same (the method of the invention for producing a color filter).

The method includes applying the curable composition of the invention onto a support to form a curable composition layer (hereinafter may be referred to as "curable composition layer formation step"), exposing the curable composition layer through a mask (hereinafter may be referred to as "exposure step"), and developing the exposed curable composition layer to form a color pattern (hereinafter may be referred to as "development step").

The steps of the producing method of the invention are further described below.

Curable Composition Layer Formation Step

In the curable composition layer formation step, the curable composition of the invention is applied onto a support, thereby forming a curable composition layer.

The support may be a photoelectric conversion substrate used for an image sensor such as a silicon substrate or a complementary metal oxide film semiconductor (CMOS).

As necessary, the support may have thereon an undercoat layer for the purpose of improving adhesion to the upper layer, preventing diffusion of substances, or flattening the substrate surface.

The application of the curable composition of the invention onto a support may be achieved by any method such as slit coating, ink jet process, rotary coating, cast coating, roll coating, or screen printing. Of these methods, rotary coating is generally used.

The coating thickness of the curable composition is preferably from 0.1 µm to 5 µm, more preferably from 0.2 µm to 3 µm, and even more preferably from 0.2 µm to 2 µm.

Drying (prebaking) of the photocurable composition layer applied to the support may be carried out using a hot plate or an oven at 50° C. to 140° C. for 10 to 300 seconds.

Exposure Step

In the exposure step, the curable composition layer formed in the curable composition layer formation step is exposed in a pattern-wise manner. The pattern exposure may be performed by scanning exposure, or exposure through a mask having a predetermined mask pattern. In order to achieve a high resolution, exposure through a mask pattern is preferable.

In this step, the coated layer is exposed in a pattern-wise manner (preferably through a predetermined mask pattern), thereby selectively curing the photoirradiated portion of the coated layer. In the subsequent development step, development is carried out using a developing solution, thereby forming a film having a pattern of pixels for the respective colors (three or four colors).

The radiation used in the exposure is preferably ultraviolet radiation such as g-line or i-line radiation. The radiation dose is preferably from 30 mJ/cm$^2$ to 1500 mJ/cm$^2$, more preferably from 50 mJ/cm$^2$ to 1000 mJ/cm$^2$, and still more preferably from 80 mJ/cm$^2$ to 500 mJ/cm$^2$.

Development Step

Subsequently, the development step including alkali development is carried out to elute the unexposed portion into an alkaline aqueous solution, thereby selectively leaving the photocured portion.

The developing solution is preferably an organic alkaline developing solution which will not damage the circuit on the support. The development conditions may be established as appropriate. The development temperature is typically from 20° C. to 30° C., and the development time is from 20 seconds to 180 seconds.

Examples of the alkaline agent used to make the developing solution include organic alkaline compounds such as ammonia water, ethylamine, diethylamine, dimethylethanolamine, tetramethylammonium hydroxide, tetraethyl ammonium hydroxide, choline, pyrrole, piperidine, and 1,8-diazabicyclo-[5,4,0]-7-undecene. The alkaline chemical is diluted with pure water to a concentration of from 0.001% by mass to 10% by mass, preferably from 0.01% by mass to 1% by mass to make an aqueous alkaline solution, and the solution is suitable as the developing solution. When the aqueous alkaline solution is used as the developing solution, the solution is generally rinsed with pure water after development.

Subsequently, the coated layer is washed to remove excessive portions of the developing solution, dried, and then subjected to heat treatment (postbaking). The above-described steps are carried out for the respective colors, thereby producing cured films. As a result of this, a color filter is obtained.

The postbaking is heat treatment carried out after development for the purpose of completing curing, and the heat curing treatment is carried out typically at 100° C. to 240° C. When the substrate is a glass or silicon substrate, the temperature is more preferably from 200° C. to 240° C.

The postbaking treatment for the coated layer after development may be carry out in a continuous or batch manner under the above-described conditions using a heating unit such as a hot plate, a convection oven (hot air circulating dryer), or a high-frequency heater.

In the producing method of the invention, after the curable composition layer formation step, exposure step and development step, a curing step for curing the formed color patterns through heating and/or light exposure may be further carried out.

The above-described curable composition layer formation step, exposure step, and development step (and as necessary a curing step) are repeatedly carried out for desired number of hues (for example, three or four colors) to make color patterns, thereby making a color filter of a desired hue.

The color filter of the invention is formed using the colored curable composition of the invention, so that the formed color pattern gives good adhesion to the supporting substrate, high exposure sensitivity, and good adhesion to the substrate in the exposed areas. In addition, the formation of needle crystals is suppressed in the cured film even when a polyhalogenated zinc phthalocyanine pigment is used as a colorant. As a result, a pattern with high resolution and high chroma may be formed. Accordingly, the color filter is suitable for a solid-state image sensor such as a CCD, and particularly suitable for a CCD element and a CMOS with high resolution exceeding 1,000,000 pixels. The color filter of the invention is useful as, for example, a color filter for a CCD, wherein the color filter is disposed between the light receiving portion of each pixel and the microlense for condensing light.

EXAMPLES

Hereinafter, the invention is further illustrated below with reference to examples, but the invention will not be limited to these examples unless departing from the scope of the invention. Unless otherwise specified, "part(s)" is expressed in terms of mass.

Example 1

1-1. Preparation of Green Pigment Dispersion Liquid
Preparation of Green Pigment Dispersion Liquid A mixed liquid containing 12.6 parts of a pigment mixture of C.I. Pigment Green 58 (polyhalogenated zinc phthalocyanine pigment of the invention) and C.I. Pigment Yellow 139 (mixed in a mass ratio of 100/55), 5.2 parts of a dispersant DISPERBYK 2001 (trade name, manufactured by BYK-Chemie (BYK), solid content 45.1% by mass), 2.7 parts of a dispersing resin P-1 (above-described polymer compound (P-1)), and 78.3 parts of propylene glycol monomethyl ether acetate as a solvent was stirred and dispersed in a bead mill for 15 hours, thereby preparing a green pigment dispersion liquid.

1-2. Preparation of Red Pigment Dispersion Liquid
Preparation of Red Pigment Dispersion Liquid A mixed liquid containing 12.1 parts of a pigment mixture of C.I. Pigment Red 254 and C.I. Pigment Yellow 139 (mixed in a mass ratio of 100/45), 10.4 parts of a dispersant DISPERBYK 2001 (trade name, manufactured by BYK-Chemie (BYK), solid content 45.1% by mass), 3.8 parts of a dispersing resin P-2 (above-described polymer compound (P-2)), and 73.7 parts of propylene glycol monomethyl ether acetate as a solvent was stirred and dispersed in a bead mill for 15 hours, thereby preparing a red pigment dispersion liquid.

1-3. Preparation of Blue Pigment Dispersion Liquid
Preparation of Blue Pigment Dispersion Liquid A mixed liquid containing 14 parts of a pigment mixture of C.I. Pigment Blue 15:6 and C.I. Pigment Violet 23 (mixed in a mass ratio of 100/25), 4.7 parts of a dispersant DISPERBYK 2001 (trade name, manufactured by BYK-Chemie (BYK), solid content 45.1% by mass), 3.5 parts of a dispersing resin P-2 (above-described polymer compound (P-2)), and 77.8 parts of propylene glycol monomethyl ether acetate as a solvent was stirred and dispersed in a bead mill for 15 hours, thereby preparing a blue pigment dispersion liquid.

1-4. Preparation of Green Colored Curable Composition (Coating Liquid) A-1

The green pigment dispersion liquid obtained above was mixed in the following composition, and the mixture was stirred to prepare a green colored curable composition A-1.
Composition

| | |
|---|---|
| Green pigment dispersion liquid | 83.3 parts |
| Alkali soluble resin: P-1 | 1.0 part |
| OXE-01 (manufactured by Ciba Specialty Chemicals; photopolymerization initiator) | 1.2 parts |
| Monomer 1: compound M-1 | 1.4 parts |
| Monomer 2: M-305 (manufactured by Toagosei Co., Ltd.) | 1.4 parts |
| Compound: compound having at least a structure represented by Formula (A) (80% solution of the above-described compound (A-8), manufactured by Sigma-Aldrich Co.) | 1.31 parts |
| P-methoxyphenol | 0.001 parts |
| Polyethylene glycol methyl ether acetate (solvent, hereinafter referred to as PGMEA) | 7.4 parts |
| Surfactant: F-781 (0.2% solution in PGMEA, manufactured by DIC Corporation) | 4.2 parts |

1-5. Preparation of Red Colored Curable Composition (Coating Liquid) B-1 and B2

The red pigment dispersion liquid obtained above was mixed in the following composition, and the mixture was stirred to prepare red colored curable compositions B-1 and B-2.

Composition of B-1

| | |
|---|---|
| Red pigment dispersion liquid | 59.6 parts |
| Alkali soluble resin: P-1 | 1.2 parts |
| OXE-02 (manufactured by Ciba Specialty Chemicals; photopolymerization initiator) | 0.7 parts |
| Monomer 1: compound M-1 | 1.6 parts |
| Monomer 2: SR-494 (manufactured by Sartomer Company, Inc.) | 1.6 parts |
| P-methoxyphenol | 0.002 parts |
| PGMEA (solvent) | 31 parts |
| Surfactant: F-781 (0.2% solution in PGMEA, manufactured by DIC Corporation) | 4.2 parts |

Composition of B-2

| | |
|---|---|
| Red pigment dispersion liquid | 59.6 parts |
| Alkali soluble resin: benzyl methacrylate/methacrylic acid/2-hydroxyethyl methacrylate copolymer (mass average molecular weight Mw: 30,000) | 0.3 parts |
| OXE-02 (manufactured by Ciba Specialty Chemicals; photopolymerization initiator) | 0.7 parts |
| Monomer 1: compound M-1 | 1.6 parts |
| Monomer 2: SR-494 (manufactured by Sartomer Company, Inc.) | 1.6 parts |
| epoxy resin: EHPE3150 (epoxy compound, manufactured by Daicel Chemical Industries, Ltd.) | 0.9 parts |
| P-methoxyphenol | 0.002 parts |
| PGMEA (solvent) | 31 parts |
| Surfactant: F-781 (0.2% solution in PGMEA, manufactured by DIC Corporation) | 4.2 parts |

1-6. Preparation of Blue Colored Curable Composition (Coating Liquid) C-1 and C-2

The blue pigment dispersion liquid obtained above was mixed in the following composition, and the mixture was stirred to prepare blue colored curable compositions C-1 and C-2.

Composition of C-1

| | |
|---|---|
| Blue pigment dispersion liquid | 50.6 parts |
| Alkali soluble resin: P-1 | 2.1 parts |
| OXE-01 (manufactured by Ciba Specialty Chemicals; photopolymerization initiator) | 1.2 parts |
| Monomer 1: compound M-1 | 3.5 parts |
| Monomer 2: SR-494 (manufactured by Sartomer Company, Inc.) | 1.2 parts |
| P-methoxyphenol | 0.002 parts |
| PGMEA (solvent) | 36 parts |
| Surfactant: F-781 (0.2% solution in PGMEA, manufactured by DIC Corporation) | 4.2 parts |

Composition of C-2

| | |
|---|---|
| Blue pigment dispersion liquid | 50.6 parts |
| Alkali soluble resin: benzyl methacrylate/methacrylic acid/2-hydroxyethyl methacrylate copolymer (mass average molecular weight Mw: 30,000) | 2.1 parts |
| OXE-02 (manufactured by Ciba Specialty Chemicals; photopolymerization initiator) | 1.2 parts |
| Monomer 1: compound M-1 | 3.5 parts |
| Monomer 2: SR-494 (manufactured by Sartomer Company, Inc.) | 1.2 parts |
| epoxy resin: EHPE3150 (epoxy compound, manufactured by Daicel Chemical Industries, Ltd.) | 1.0 part |
| P-methoxyphenol | 0.002 parts |
| PGMEA (solvent) | 36 parts |

-continued

| Surfactant: F-781 (0.2% solution in PGMEA, manufactured by DIC Corporation) | 4.2 parts |

1-7. Formation of Color Patterns

The green colored curable composition A-1 prepared as described above was applied onto an 8-inch silicon wafer, on which hexamethyldisilazane had been sprayed in advance, thereby forming a photocurable coated layer. The coated layer was subjected to heat treatment (prebaking) on a hot plate at 100° C. for 180 seconds to give a dry film thickness of 1.0 μm. Subsequently, using an i-line stepper exposure equipment FPA-3000i5+ (manufactured by Canon Inc.), the coated layer was exposed to light having a wavelength of 365 nm through a 1.0-μm-square bayer pattern mask at a radiation dose appropriate for forming a 1.0-μm-square bayer pattern (the dose had been selected within the range of from 50 to 1000 mJ/cm² in advance). Thereafter, the silicon wafer having the irradiated coated layer was mounted on a horizontal rotary table of a spin shower developing machine (trade name: DW-30, manufactured by Chemitronics Co.), and subjected to puddle development at 23° C. for 180 seconds using a 40% diluted solution of CD-2000 (manufactured by Fujifilm Electronic Materials Co., Ltd.), thereby forming a green color pattern on the silicon wafer.

The silicon wafer having the green color pattern was fixed on the horizontal rotary table using a vacuum chuck, and rinsed by a shower of pure water fed from a jet nozzle above the center of rotation while the silicon wafer being rotated by a rotator at a rotation speed of 50 rpm, followed by spray drying.

Thereafter, the wafer was heated for 5 minutes on a hot plate at 200° C., thereby obtaining a color filter having a pattern.

The same steps as those of the green pattern formation were carried out using each of the red colored curable composition B-2 and the blue colored curable composition C-2, except that the coated layer was exposed to light through a 1.0-μm-square island pattern mask, thus forming a color filter having red (R), green (G), and blue (B) patterns (pixels).

1-8. Evaluation

1-8-1. Presence or Absence of Needle Crystals

The color filter obtained by the above-described procedure was heated on a hot plate at 260° C. for 5 minutes, the patterns were observed using a scanning electron microscope (SEM) under 20,000 magnification, and the degree of occurrence of needle matter was evaluated according to the following criteria.

Evaluation Criteria
  A: no occurrence of needle matter
  B: negligible occurrence of minute needle matter
  C: acceptable occurrence of needle matter
  D: unacceptable occurrence of needle matter

1-8-2. Evaluation of Rectangular Shape of Pattern Formed Using Curable Color Composition after Postbaking A single green pattern obtained by the above-described procedure was baked on a hot plate at 200° C. for 5 minutes. After that, the cross-sectional shape of the pattern was observed using a scanning electron microscope (SEM), and evaluated in accordance with the following criteria using the index obtained by the expression described below. Here, the cross-sectional shape refers to the shape of a cross section of a pattern formed as a layer, which is obtained by cutting the pattern in a plane perpendicular to the surface of the pattern. In the evaluation, a pattern having a rectangular pattern profile is preferable.

Pattern rectangularity index (S)=Line width of pattern cross section at interface with substrate/Line width of pattern cross section at surface that does not contact substrate Evaluation Criteria
  S>1.20: The cross section had a tapered pattern profile.
  0.95≤S≤1.20: The cross section had a rectangular pattern profile.
  S<0.95: The cross section had a reverse-tapered pattern profile.

1-8-3. Evaluation of Y Value (Brightness)

In a separate experiment, a cured color film was formed on a glass substrate in the same manner as described above, except that the entire surface of the substrate was exposed to light without using a mask instead of the pattern exposure. After the substrate was subjected to postbaking, the brightness (Y value) was measured using a spectrophotometer MCPD3000 (trade name, manufactured by Otsuka Electronics Co., Ltd.).

Note that, when C.I. Pigment Green 58 used as the green pigment in Example 1 was changed to C.I. Pigment Green 36, the obtained brightness (Y value) was 55.4, which was inferior to that obtained when C.I. Pigment Green 58 was used.

Examples 2 to 21

Comparative Example 1

Evaluations were made in the same manner as in Example 1, except that the type and proportion of pigments used for the preparation of pigment dispersion liquids, the type and amount of the specific compound (A), the type of the initiator, the proportions of these components, and the composition used for forming the red pattern and/or the blue pattern were changed as listed in Tables 1 and 2 to prepare the colored curable composition. The addition amount change of the specific compound (A) was adjusted by changing the addition amount of the alkali soluble resin. The evaluation results are shown in Tables 1 and 2.

TABLE 1

| | | Yellow Pigment | | | Specific compound (A) | | |
|---|---|---|---|---|---|---|---|
| | | | Pigment Green 58/Pigment | Red pattern Red | Blue pattern Blue | | Molecular | |
| | Pigment | Yellow ratio | composition | composition | Compound | weight | Content |
| Ex. 1 | Pigment Yellow 139 | 100/55 | B-2 | C-2 | A-8 | 1750 | 5.00% |
| Ex. 2 | Pigment Yellow 139 | 100/55 | B-2 | C-2 | A-8 | 1750 | 0.09% |

TABLE 1-continued

| | | | | | | | |
|---|---|---|---|---|---|---|---|
| Ex. 3 | Pigment Yellow 139 | 100/55 | B-2 | C-2 | A-8 | 1750 | 0.10% |
| Ex. 4 | Pigment Yellow 139 | 100/55 | B-2 | C-2 | A-8 | 1750 | 10.00% |
| Ex. 5 | Pigment Yellow 139 | 100/55 | B-2 | C-2 | A-8 | 1750 | 10.10% |
| Ex. 6 | Pigment Yellow 139 | 100/55 | B-2 | C-2 | A-8 | 1750 | 5.00% |
| Ex. 7 | Pigment Yellow 139 | 100/55 | B-2 | C-2 | A-8 | 1750 | 5.00% |
| Ex. 8 | Pigment Yellow 139 | 100/55 | B-2 | C-2 | A-2 | 390 | 5.00% |
| Ex. 9 | Pigment Yellow 139 | 100/55 | B-2 | C-2 | A-6 | 643 | 5.00% |
| Ex. 10 | Pigment Yellow 139 | 100/55 | B-2 | C-2 | A-11 | 500 | 5.00% |
| Ex. 11 | Pigment Yellow 139 | 100/55 | B-2 | C-2 | A-9 | 1250 | 5.00% |

| | | | Evaluation results | | |
|---|---|---|---|---|---|
| | Photo-polymerization initiator | Polymerizable compound | Observation of needle crystals | Pattern rectangularity index (S) | Y value |
| Ex. 1 | OXE-01 | M-1/M-305 | A | 1.03 | 61.1 |
| Ex. 2 | OXE-01 | M-1/M-305 | C | 1.18 | 61.1 |
| Ex. 3 | OXE-01 | M-1/M-305 | B | 1.17 | 61.1 |
| Ex. 4 | OXE-01 | M-1/M-305 | A | 0.96 | 61.1 |
| Ex. 5 | OXE-01 | M-1/M-305 | A | 0.94 | 61.1 |
| Ex. 6 | IRGACURE 369 | M-1/M-305 | C | 1.07 | 61.1 |
| Ex. 7 | I-1 | M-1/M-305 | B | 1.03 | 61.1 |
| Ex. 8 | OXE-01 | M-1/M-305 | C | 1.04 | 61.1 |
| Ex. 9 | OXE-01 | M-1/M-305 | C | 1.04 | 61.1 |
| Ex. 10 | OXE-01 | M-1/M-305 | B | 1.03 | 61.1 |
| Ex. 11 | OXE-01 | M-1/M-305 | A | 1.03 | 61.1 |

TABLE 2

| | Yellow Pigment | | Red pattern | Blue pattern | Specific compound (A) | | |
|---|---|---|---|---|---|---|---|
| | Pigment | Pigment Green 58/Pigment Yellow ratio | Red composition | Blue composition | Compound | Molecular weight | Content |
| Ex. 12 | Pigment Yellow 150 | 100/55 | B-2 | C-2 | A-8 | 1750 | 5.00% |
| Ex. 13 | Pigment Yellow 185 | 100/55 | B-2 | C-2 | A-8 | 1750 | 5.00% |
| Ex. 14 | Pigment Yellow 139 | 100/49 | B-2 | C-2 | A-8 | 1750 | 5.00% |
| Ex. 15 | Pigment Yellow 139 | 100/50 | B-2 | C-2 | A-8 | 1750 | 5.00% |
| Ex. 16 | Pigment Yellow 139 | 100/60 | B-2 | C-2 | A-8 | 1750 | 5.00% |
| Ex. 17 | Pigment Yellow 139 | 100/61 | B-2 | C-2 | A-8 | 1750 | 5.00% |
| Ex. 18 | Pigment Yellow 139 | 100/55 | B-1 | C-1 | A-8 | 1750 | 5.00% |
| Ex. 19 | Pigment Yellow 139 | 100/55 | B-2 | C-2 | A-8 | 1750 | 5.00% |
| Ex. 20 | Pigment Yellow 139 | 100/55 | B-2 | C-2 | A-11 | 10000 | 5.00% |
| Ex. 21 | Pigment Yellow 139 | 100/55 | B-2 | C-2 | A-11 | 10200 | 5.00% |
| Comp. Ex. 1 | Pigment Yellow 139 | 100/55 | B-2 | C-2 | None | — | — |

TABLE 2-continued

|  | Photo-polymerization initiator | Polymerizable compound | Evaluation results | | |
|---|---|---|---|---|---|
|  |  |  | Observation of needle crystals | Pattern rectangularity index (S) | Y value |
| Ex. 12 | OXE-01 | M-1/M-305 | B | 1.09 | 69.7 |
| Ex. 13 | OXE-01 | M-1/M-305 | B | 1.07 | 65 |
| Ex. 14 | OXE-01 | M-1/M-305 | B | 1.04 | 61.2 |
| Ex. 15 | OXE-01 | M-1/M-305 | A | 1.03 | 61.2 |
| Ex. 16 | OXE-01 | M-1/M-305 | A | 1.03 | 61.1 |
| Ex. 17 | OXE-01 | M-1/M-305 | B | 1.03 | 61.1 |
| Ex. 18 | OXE-01 | M-1/M-305 | B | 1.03 | 61.1 |
| Ex. 19 | OXE-01 | DPHA/M-305 | C | 1.05 | 61.1 |
| Ex. 20 | OXE-01 | M-1/M-305 | B | 1.19 | 61.1 |
| Ex. 21 | OXE-01 | M-1/M-305 | C | 1.22 | 61.1 |
| Comp. Ex. 1 | OXE-01 | M-1/M-305 | D | 1.26 | 61.1 |

The alkali-soluble resin (P-1) used in the preparation of the curable color compositions was exemplary compound of polymer compound (P-1) described above, and the specific compounds (A) used in the preparation of the curable color compositions were Specific Compounds (A-1) to (A-11) described above, respectively. The structures of the polymerizable compound (M-1), the polymerizable compound (M-305), the polymerizable compound (SR-494), DPHA (trade name: KARAYAD DPHA, manufactured by Nippon Kayaku Co., Ltd.), and oxime photopolymerization initiator (I-1) are shown below. In Tables 1 and 2, the "molecular weight" indicates the number average molecular weight of the specific compound (A).

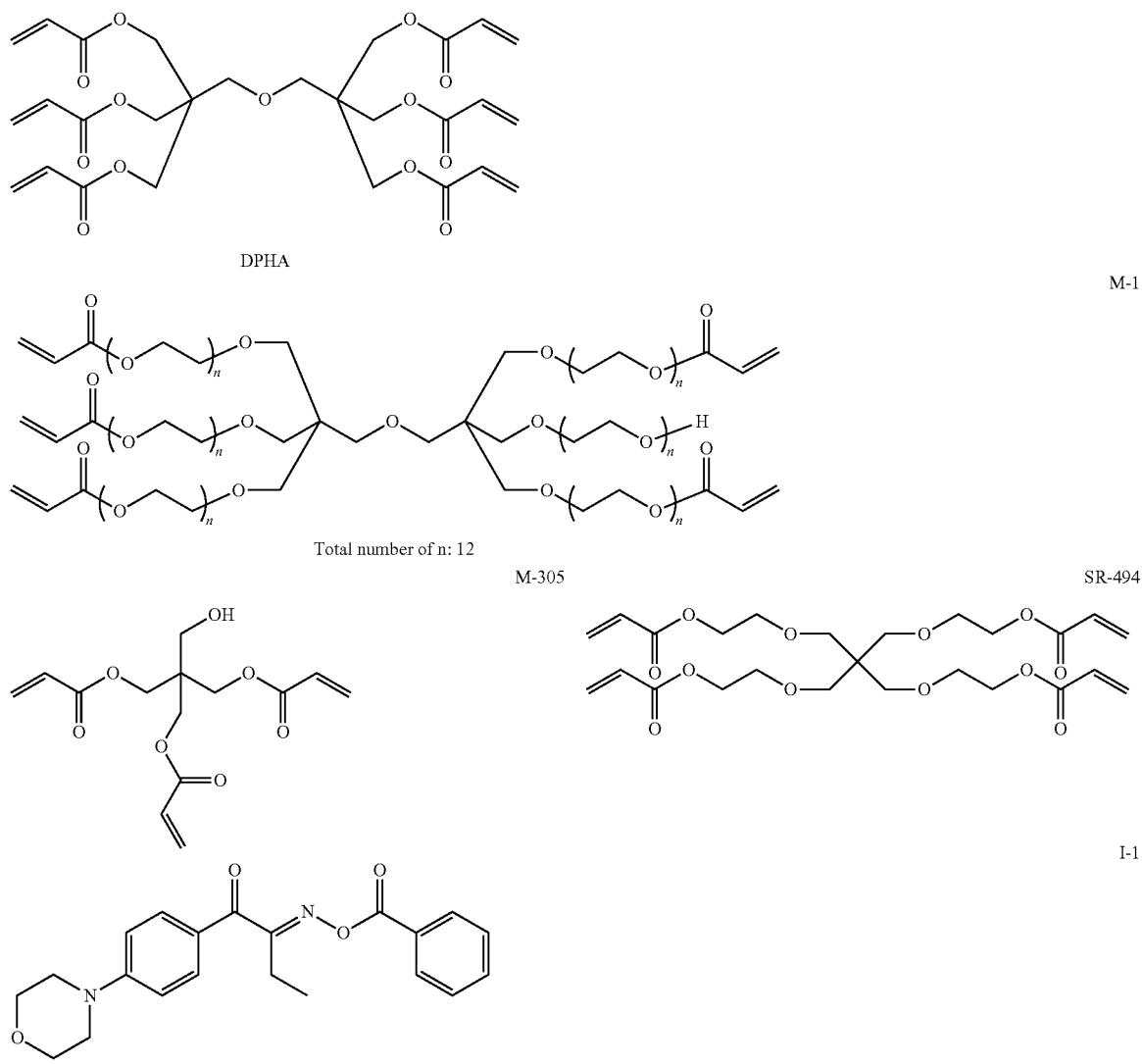

As is evident from Tables 1 and 2, in the colored curable composition of the invention, even when a polyhalogenated zinc phthalocyanine pigment is included, the generation of needle matter is prevented and a cured film having a color pattern with an excellent rectangular shape after postbaking is formed. The comparison of Examples 1, 10 and 11 with Examples 8 and 9 indicates that the invention is particularly advantageous when the specific compound (A) is an oligomer.

Example 22

Production of Solid-State Image Sensor

As described in the following example, using the method of the invention for producing a color filter, a solid-state image sensor was made using the colored curable composition for a solid-state image sensor.

2-1. Preparation of Resist Liquid

The following composition were mixed and dissolved to prepare a resist liquid.

Resist Liquid Composition

| | |
|---|---|
| Solvent: propylene glycol monomethyl ether acetate | 19.20 parts |
| Solvent: ethyl lactate | 36.67 parts |
| Alkali soluble resin: 40% PGMEA solution of benzyl methacrylate/methacrylic acid/2-hydroxyethyl methacrylate copolymer (molar ratio: 60/22/18, weight average molecular weight: 15,000, mass average molecular weight: 13,000) | 30.51 parts |
| Compound containing an ethylenically unsaturated double bond: dipentaerythritol hexaacrylate | 12.20 parts |
| Polymerization inhibitor: p-methoxyphenol | 0.0061 parts |
| Fluorine surfactant: F-475 (manufactured by DIC Corporation) | 0.83 parts |
| Photopolymerization initiator: trihalomethyltriazine photopolymerization initiator (trade name: TAZ-107, manufactured by Midori Kagaku Co., Ltd.) | 0.586 parts |

2-2. Making of Silicon Substrate Having Undercoat Layer

A 6-inch silicon wafer was heated for 30 minutes in an oven at 200° C. Subsequently, the resist liquid was applied onto the silicon wafer to give a dry film thickness of 1.5 μm, and dried for 1 hour under heating in an oven at 220° C. to form an undercoat layer, thereby obtaining a silicon wafer substrate having an undercoat layer.

2-3. Formation of Color Filter

The green, red, and blue colored curable compositions A-1, B-1, and C-1 were applied to the silicon wafer substrate having an undercoat layer, and subjected to exposure and development in the same manner as in Example 1, thereby forming a color filter with red (R), green (G), and blue (B) patterns.

2-4. Formation and Evaluation of Solid-State Image Sensor

The color filter obtained by the above producing method of the invention was attached to a solid-state image sensor according to a known method. When an image was captured by the solid-state image sensor including the color filter of the invention, it was found that the excellent image was obtained.

All publications, patent applications, and technical standards mentioned in this specification are herein incorporated by reference to the same extent as if each individual publication, patent application, or technical standard was specifically and individually indicated to be incorporated by reference.

The invention claimed is:

1. A colored curable composition for a solid-state image sensor, comprising a polyhalogenated zinc phthalocyanine pigment, and a compound having at least a structure represented by the following Formula (A):

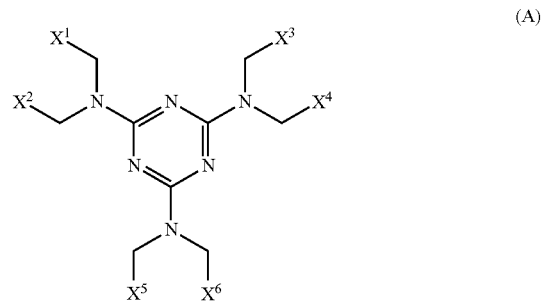

wherein, $X^1$, $X^2$, $X^3$, $X^4$, $X^5$, and $X^6$ each independently represent a substituent selected from —OH, —OR, or —NHCOCH=CH$_2$, R represents a monovalent organic group which may have a substituent; when the compound having at least a structure represented by Formula (A) is a monomolecular compound, $X^1$, $X^2$, $X^3$, $X^4$, $X^5$, and $X^6$ each have the same definitions as $X^1$, $X^2$, $X^3$, $X^4$, $X^5$, and $X^6$ above, respectively; and when the compound having at least a structure represented by Formula (A) is an oligomer, the oligomer has a configuration in which at least one of $X^1$, $X^2$, $X^3$, $X^4$, $X^5$, and $X^6$ in a structure represented by Formula (A) is eliminated to form a single bond, which is then linked, via —O—, to another structure represented by Formula (A).

2. The colored curable composition for a solid-state image sensor according to claim 1, wherein a total solid content of the compound having at least a structure represented by Formula (A) in the colored curable composition is from 0.10% by mass to 10.0% by mass.

3. The colored curable composition for a solid-state image sensor according to claim 2, wherein the compound having at least a structure represented by Formula (A) is an oligomer having a number average molecular weight of from 500 to 10,000.

4. The colored curable composition for a solid-state image sensor according to claim 2, further comprising a polymerizable compound and a photopolymerization initiator.

5. The colored curable composition for a solid-state image sensor according to claim 4, wherein the photopolymerization initiator is an oxime photopolymerization initiator.

6. The colored curable composition for a solid-state image sensor according to claim 5, wherein the oxime photopolymerization initiator is a compound represented by the following Formula (I):

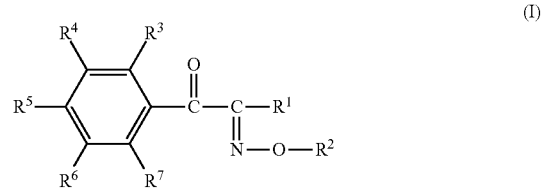

wherein, $R^1$ represents an alkyl or aryl group which may have a substituent; $R^2$ represents an acyl group which may have a substituent; $R^3$, $R^4$, $R^5$, $R^6$, and $R^7$ each independently represent a hydrogen atom or a monovalent organic group; and R³, R⁴, R⁵, R⁶, and R⁷ may be linked to each other to form a five- or six-membered ring.

7. The colored curable composition for a solid-state image sensor according to claim 2, further comprising C.I. Pigment Yellow 139 as a colorant.

8. The colored curable composition for a solid-state image sensor according to claim 7, wherein a ratio of the content of the polyhalogenated zinc phthalocyanine pigment to the content of C.I. Pigment Yellow 139 (polyhalogenated zinc phthalocyanine pigment/C.I. Pigment Yellow 139) is from 100/50 to 100/60 in terms of mass.

9. A color filter for a solid-state image sensor, comprising, on a support, a color pattern formed using the colored curable composition for a solid-state image sensor according to claim 2.

10. A method for producing a color filter for a solid-state image sensor comprising:
applying the colored curable composition for a solid-state image sensor according to claim 2 onto a support to form a colored curable composition layer;
exposing the colored curable composition layer in a pattern-wise manner; and
developing the exposed colored curable composition layer to form a color pattern.

11. The colored curable composition for a solid-state image sensor according to claim 1, wherein the compound having at least a structure represented by Formula (A) is an oligomer having a number average molecular weight of from 500 to 10,000.

12. The colored curable composition for a solid-state image sensor according to claim 1, further comprising a polymerizable compound and a photopolymerization initiator.

13. The colored curable composition for a solid-state image sensor according to claim 12, wherein the photopolymerization initiator is an oxime photopolymerization initiator.

14. The colored curable composition for a solid-state image sensor according to claim 13, wherein the oxime photopolymerization initiator is a compound represented by the following Formula (I):

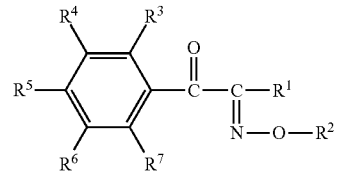

(I)

wherein, R¹ represents an alkyl or aryl group which may have a substituent; R² represents an acyl group which may have a substituent; R³, R⁴, R⁵, R⁶, and R⁷ each independently represent a hydrogen atom or a monovalent organic group; and R³, R⁴, R⁵, R⁶, and R⁷ may be linked to each other to form a five- or six-membered ring.

15. The colored curable composition for a solid-state image sensor according to claim 1, further comprising C.I. Pigment Yellow 139 as a colorant.

16. The colored curable composition for a solid-state image sensor according to claim 15, wherein a ratio of the content of the polyhalogenated zinc phthalocyanine pigment to the content of C.I. Pigment Yellow 139 (polyhalogenated zinc phthalocyanine pigment/C.I. Pigment Yellow 139) is from 100/50 to 100/60 in terms of mass.

17. A color filter for a solid-state image sensor, comprising, on a support, a color pattern formed using the colored curable composition for a solid-state image sensor according to claim 1.

18. A method for producing a color filter for a solid-state image sensor comprising:
applying the colored curable composition for a solid-state image sensor according to claim 1 onto a support to form a colored curable composition layer;
exposing the colored curable composition layer in a pattern-wise manner; and
developing the exposed colored curable composition layer to form a color pattern.

* * * * *